United States Patent
Nakashima

(10) Patent No.: US 11,107,660 B2
(45) Date of Patent: Aug. 31, 2021

(54) MULTI-CHARGED PARTICLE BEAM IMAGE ACQUISITION APPARATUS AND MULTI-CHARGED PARTICLE BEAM IMAGE ACQUISITION METHOD

(71) Applicant: NuFlare Technology, Inc., Yokohama (JP)

(72) Inventor: Kazuhiro Nakashima, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/899,044

(22) Filed: Jun. 11, 2020

(65) Prior Publication Data

US 2021/0005422 A1    Jan. 7, 2021

(30) Foreign Application Priority Data

Jul. 2, 2019 (JP) .............................. JP2019-123994

(51) Int. Cl.
*H01J 37/317* (2006.01)
*H01J 37/147* (2006.01)
*H01J 37/22* (2006.01)

(52) U.S. Cl.
CPC ...... *H01J 37/3177* (2013.01); *H01J 37/1474* (2013.01); *H01J 37/222* (2013.01)

(58) Field of Classification Search
CPC ... H01J 37/3177; H01J 37/1474; H01J 37/222
See application file for complete search history.

(56) References Cited

U.S. PATENT DOCUMENTS

2008/0099675 A1   5/2008 Hiroi et al.

FOREIGN PATENT DOCUMENTS

JP          2011-3930 A      1/2011

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

A multi-charged particle beam image acquisition apparatus includes an image acquisition mechanism, including a stage on which a target object is capable to be disposed and a deflector for deflecting multiple charged particle beams in array arrangement, configured to acquire, in a state where a scan region width to be scanned by each of the multiple beams has been set depending on an image averaging frequency, image data of each beam by scanning the target object with deflected multiple beams while relatively shifting a stage moving direction angle and an array arranging direction angle of the multiple beams from each other, and an averaging circuit configured to average, using image data of each beam, errors of the image data by superimposing image data of the same position at the image averaging frequency.

14 Claims, 18 Drawing Sheets

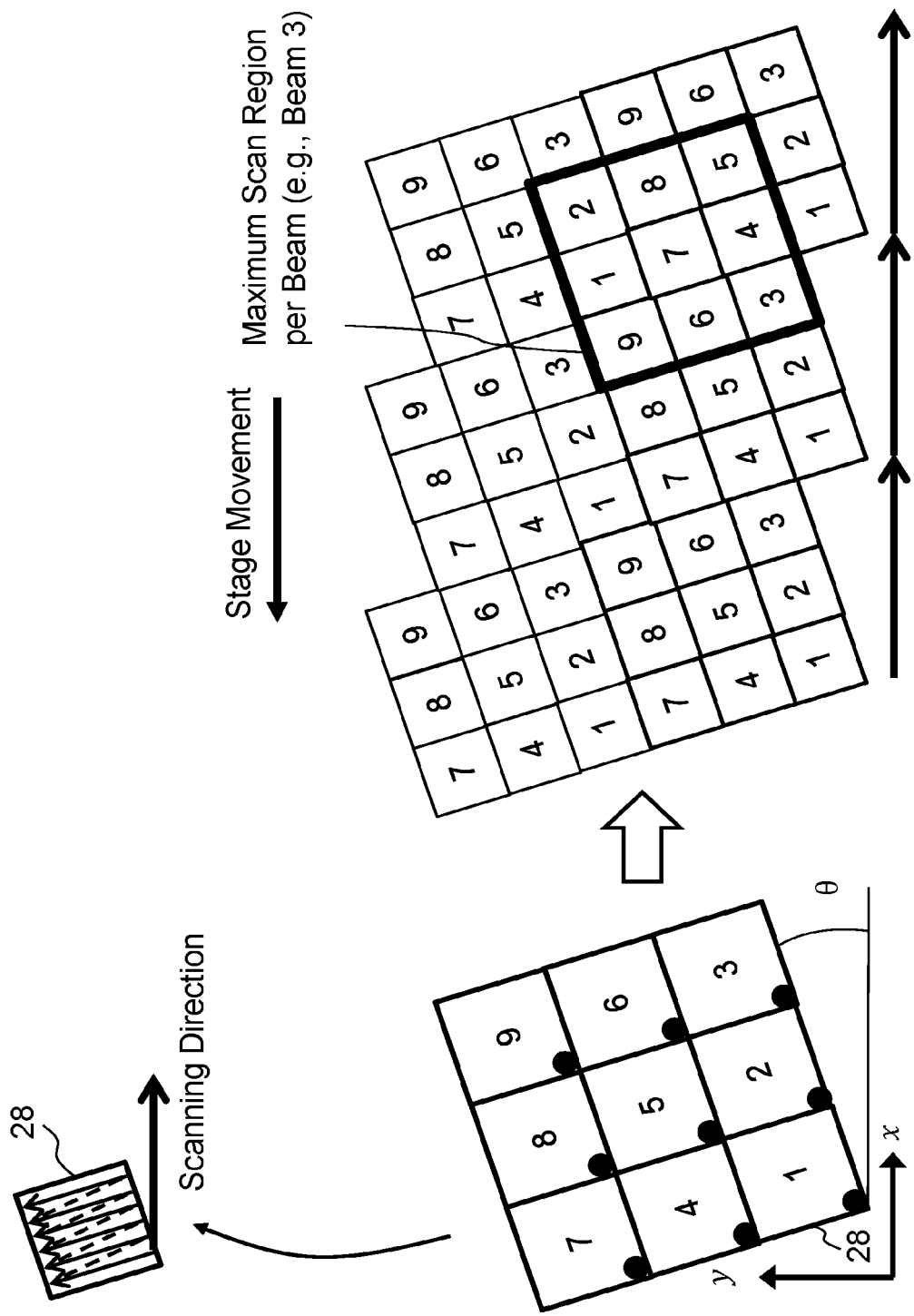

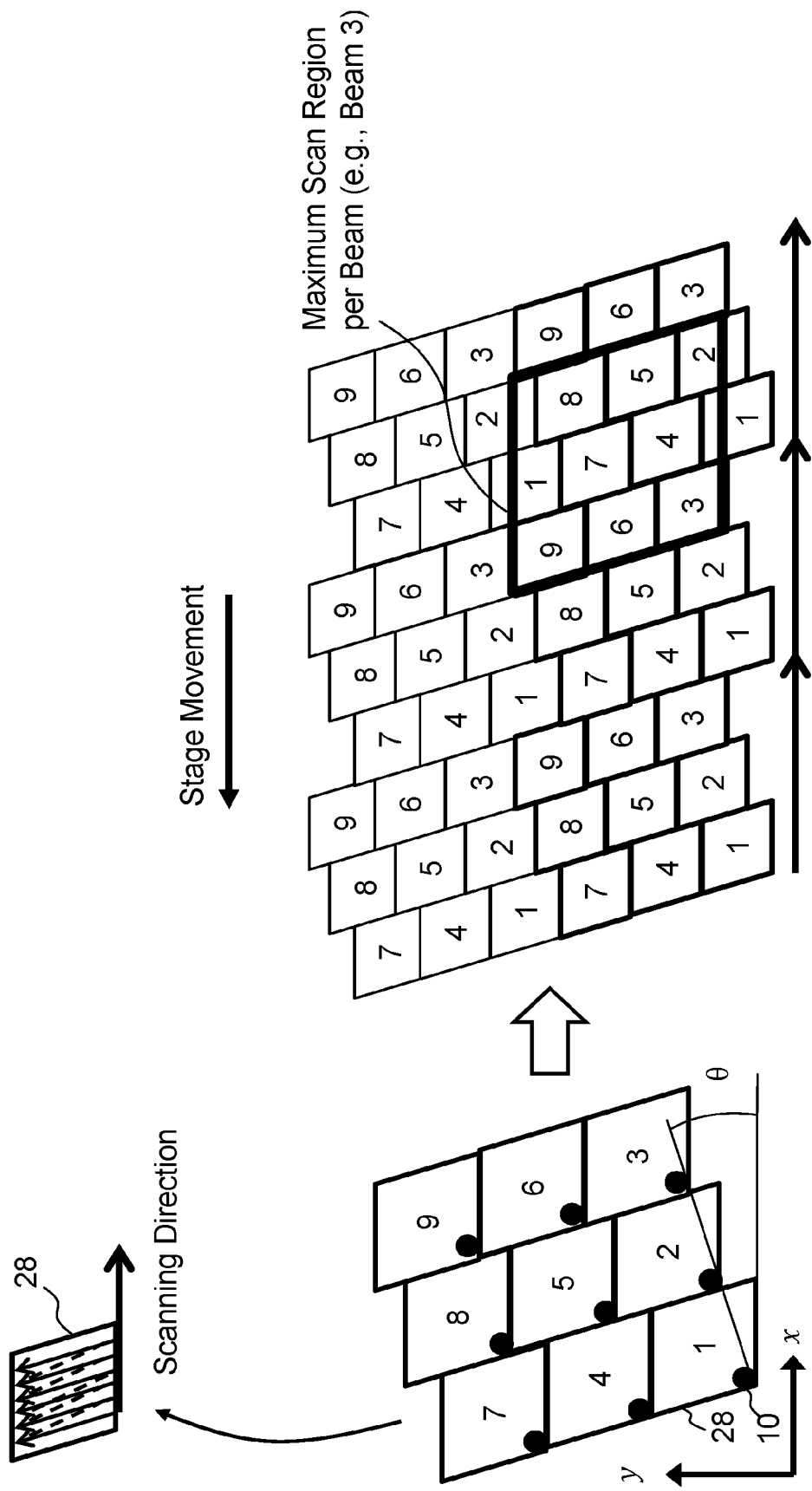

MULTI-CHARGED PARTICLE BEAM IMAGE ACQUISITION APPARATUS AND MULTI-CHARGED PARTICLE BEAM IMAGE ACQUISITION METHOD

CROSS-REFERENCE TO RELATED APPLICATION

This application is based upon and claims the benefit of priority from prior Japanese Patent Application No. 2019-123994 filed on Jul. 2, 2019 in Japan, the entire contents of which are incorporated herein by reference.

BACKGROUND OF THE INVENTION

Field of the Invention

Embodiments of the present invention relate to a multi-charged particle beam image acquisition apparatus and a multi-charged particle beam image acquisition method. For example, embodiments of the present invention relate to a method for acquiring a secondary electron image of a pattern which is emitted due to irradiation by electron multiple beams and is to be imaged by an inspection apparatus.

In recent years, with the advance of high integration and large capacity of LSI (Large Scale Integrated circuits), the line width (critical dimension) required for circuits of semiconductor elements is becoming progressively narrower. Since LSI manufacturing requires a tremendous amount of manufacturing cost, it is crucially essential to improve its yield. However, as typified by a 1-gigabit DRAM (Dynamic Random Access Memory), the scale of patterns configuring an LSI is in transition from on the order of sub-microns to on the order of nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultra-fine pattern onto a semiconductor wafer by the photolithography technology. Therefore, the pattern inspection apparatus for inspecting defects on a transfer mask used in the manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there is "die-to-die inspection" or "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After performing alignment between the images, the comparison circuit compares the measured data with reference data according to an appropriate algorithm, and determines that there is a pattern defect if the compared data do not match each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with primary electron beams and detecting secondary electrons emitted from the inspection substrate due to the irradiation with the primary electron beams. Not only the single beam system that uses one electron beam but the multi-beam system that acquires an image by using a plurality of electron beams is also under development. Images acquired with such electron beams include a noise component. Such a noise component can be reduced by increasing the amount of electrons. However, if the electron amount is increased, a target object may receive damage. Then, it is examined to reduce the noise component by filtering. However, in the filtering processing, since averaging (equalization) is performed using images of different positions, so-called blurring occurs. Therefore, it is now examined to acquire the same images a plurality of times by repeating scanning the same line in order to perform averaging of the image data by using the repeated times (e.g., refer to Japanese Unexamined Patent Publication No. 2011-003930). However, it takes long to perform a scanning operation a plurality of times, which results in a problem that the image acquisition time becomes long. Moreover, in the multi-beam system, if a large variability exists among beams, there is a stability problem in detection sensitivity when performing an inspection using acquired images. Thus, a noise reduction problem of images may occur not only in the inspection apparatus but also in all the apparatuses acquiring images with electron beams.

BRIEF SUMMARY OF THE INVENTION

According to one aspect of the present invention, a multi-charged particle beam image acquisition apparatus includes an image acquisition mechanism, including a stage on which a target object is capable to be disposed and a deflector which deflects multiple charged particle beams in an array arrangement, configured to acquire, in a state where a scan region width to be scanned by each beam of the multiple charged particle beams has been set depending on an image averaging frequency, image data of the each beam by scanning the target object with the multiple charged particle beams deflected by the deflector while relatively shifting an angle of a moving direction of the stage and an angle of an array arranging direction of the multiple charged particle beams from each other; and an averaging circuit configured to average, using the image data of the each beam, errors of the image data by superimposing image data of a same position at the image averaging frequency.

According to another aspect of the present invention, a multi-charged particle beam image acquisition method includes acquiring, in a state where a scan region width to be scanned by each beam of multiple charged particle beams in an array arrangement has been set depending on an image averaging frequency, image data of the each beam by scanning a target object disposed on a stage with the multiple charged particle beams deflected by a deflector while relatively shifting an angle of a moving direction of the stage and an angle of an array arranging direction of the multiple charged particle beams from each other; and averaging, using the image data of the each beam, errors of the image data by superimposing image data of a same position at the image averaging frequency.

BRIEF DESCRIPTION OF THE DRAWINGS

FIG. 4A shows that according to a comparative example and FIG. 4B shows that according to the first embodiment;

FIGS. 14A and 14B illustrate scanning operations with multiple beams according to a second embodiment;

FIGS. 15A and 15B illustrate scanning operations with multiple beams according to a third embodiment;

DETAILED DESCRIPTION OF THE INVENTION

Embodiments below describe an image acquisition apparatus and method that can reduce a noise, based on averaging processing corresponding to a necessary frequency (the number of times) used for averaging when acquiring an image with multiple beams, without repeatedly scanning the same position the number of times needed as the averaging frequency.

First Embodiment

Figure 1:
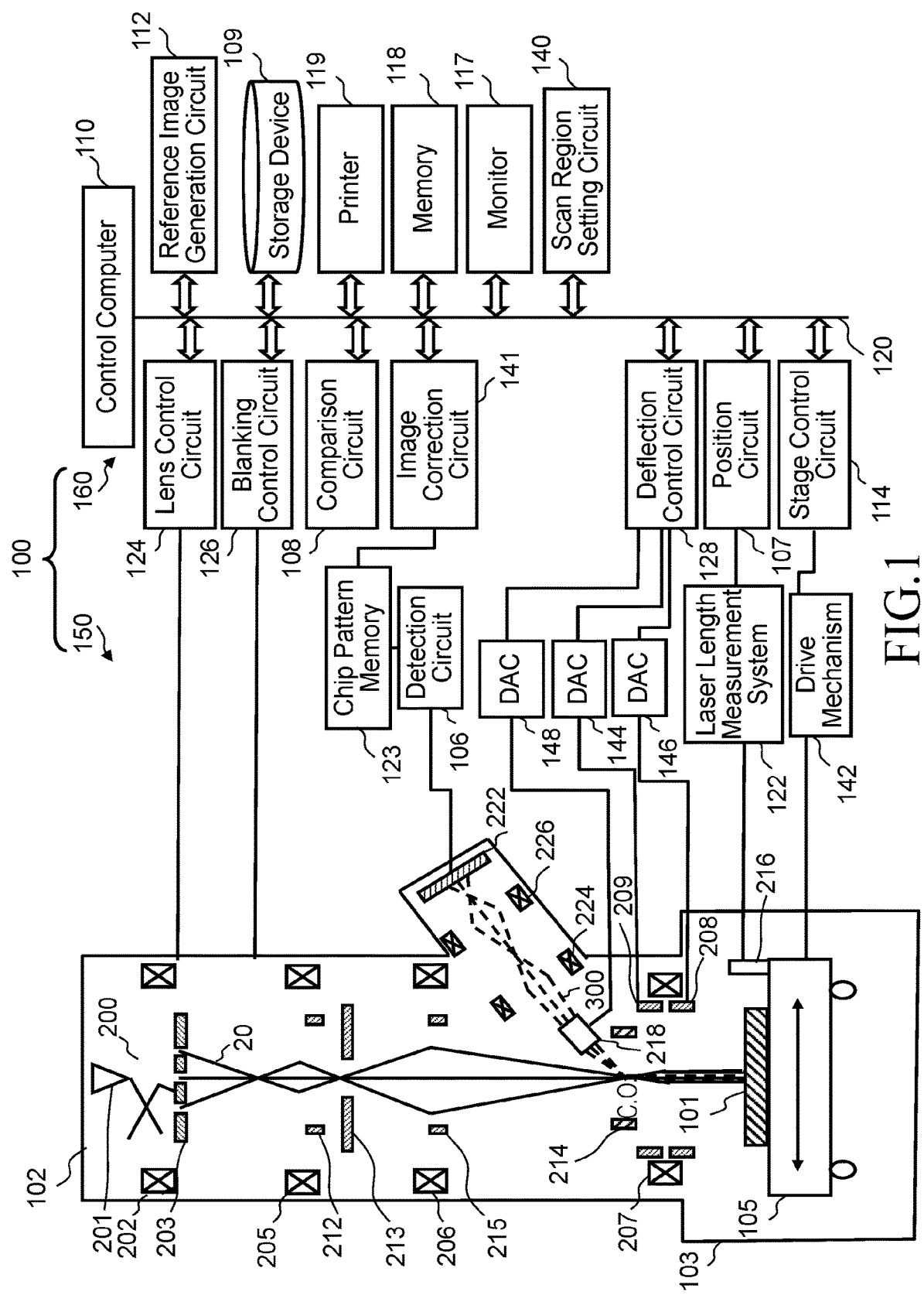
FIG. 1 shows an example of a configuration of a pattern inspection apparatus according to a first embodiment.

FIG. 1 shows an example of a configuration of a pattern inspection apparatus according to a first embodiment. In FIG. 1, an inspection apparatus 100 for inspecting patterns formed on a substrate is an example of a multi electron beam inspection apparatus. The inspection apparatus 100 includes an image acquisition mechanism 150 (secondary electron image acquisition mechanism) and a control system circuit 160. The image acquisition mechanism 150 includes an electron beam column 102 (also called an electron optical column) and an inspection chamber 103. In the electron beam column 102, there are disposed an electron gun 201, an electromagnetic lens 202, a shaping aperture array substrate 203, an electromagnetic lens 205, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222. In the case of FIG. 1, a primary electron optical system that irradiates a substrate 101 with multiple primary electron beams 20 is composed of the electron gun 201, the electromagnetic lens 202, the shaping aperture array substrate 203, the electromagnetic lens 205, the common blanking deflector 212, the limiting aperture substrate 213, the electromagnetic lens 206, the electromagnetic lens 207 (objective lens), the main deflector 208, and the sub deflector 209. A secondary electron optical system that irradiates the multi-detector 222 with multiple secondary electron beams 300 is composed of the beam separator 214, the deflector 218, the electromagnetic lens 224, and the electromagnetic lens 226. Further, it is also preferable to dispose an electrostatic lens 215 that can rotate a multiple primary electron beam image, in the magnetic field of the electromagnetic lens 206.

A stage 105 movable at least in the x and y directions is disposed in the inspection chamber 103. The substrate 101 (target object) to be inspected is mounted on the stage 105. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the stage 105, for example. Moreover, on the stage 105, there is disposed a mirror 216 which reflects a laser beam for measuring a laser length emitted from a laser length measuring system 122 arranged outside the inspection chamber 103. The multi-detector 222 is connected, at the outside of the electron beam column 102, to a detection circuit 106.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a scan region setting circuit 140, an image correction circuit 141, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The detection circuit 106 is connected to a chip pattern memory 123 which is connected to the image correction circuit 141. The stage 105 is driven by a drive mechanism 142 under the control of the stage control circuit 114. In the drive mechanism 142, a drive system such as a three (x-, y-, and θ-) axis motor which provides drive in the directions of x, y, and θ in the stage coordinate system is configured, and the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The moving position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216.

The electromagnetic lenses 202, 205, 206, 207 (objective lens), 224 and 226, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 146. When the electrostatic lens 215 is disposed, a lens control circuit (not shown) is arranged.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, applying a voltage to another extraction electrode (Wehnelt) and heating the cathode to a predetermined temperature are performed, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
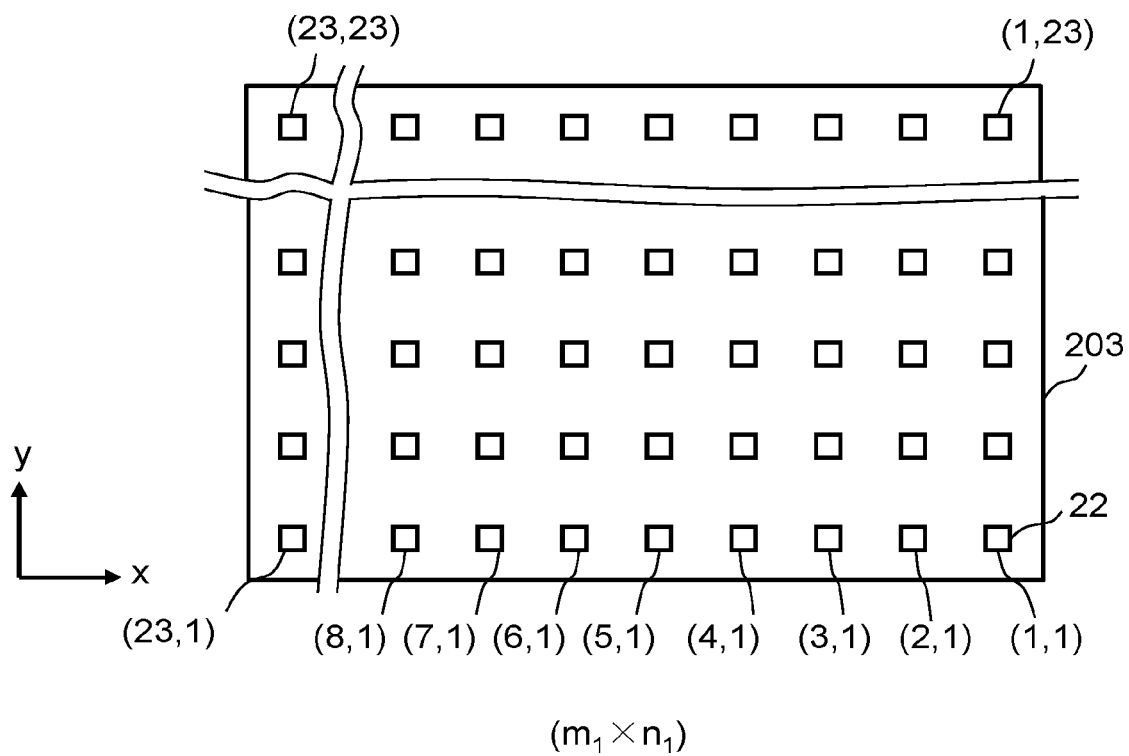
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ rows long (length in the y direction) (each row in the x direction) and $n_1$ columns wide (width in the x direction) (each column in the y direction) are two-dimensionally formed at a predetermined arrangement pitch in the shaping aperture array substrate 203, where one of $m_1$ and $n_1$ is an integer of 2 or more, and the other is an integer of 1 or more. In the case of FIG. 2, 23×23 holes (openings) 22 are formed. Ideally, each of the holes 22 is a rectangle (including a square) having the same dimension, shape, and size. Alternatively, ideally, each of the holes 22 may be a circle with the same outer diameter. $m_1 \times n_1$ (=N) multiple primary electron beams 20 are formed by letting portions of the electron beam 200 individually pass through a corresponding one of a plurality of holes 22.

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200, which irradiate the positions of a plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens) while repeating forming an intermediate image and a crossover through the beam separator 214 disposed at the crossover position of each beam of the multiple primary electron beams 20. Then, the electromagnetic lens 207 focuses the multiple primary electron beams 20 onto the substrate 101. The multiple primary electron beams 20 having been focused on the substrate 101 (target object) by the electromagnetic lens 207 (objective lens) are collectively deflected by the main deflector 208 and the sub deflector 209 to irradiate respective beam irradiation positions on the substrate 101. When all of the multiple primary electron beams 20 are collectively deflected by the common blanking deflector 212, they deviate from the hole in the center of the limiting aperture substrate 213 and blocked by the limiting aperture substrate 213. On the other hand, the multiple primary electron beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

The beam separator 214 generates an electric field and a magnetic field to be perpendicular to each other in a plane perpendicular to the traveling direction (electron orbit central axis) of the center beam of the multiple primary electron beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 having been bent obliquely upward and separated from the multiple primary electron beams 20 are further bent by the deflector 218, and projected, while being refracted, onto the multi-detector 222 by the electromagnetic lenses 224 and 226. The multi-detector 222 detects the projected multiple secondary electron beams 300. It is acceptable that reflected electrons and secondary electrons are projected on the multi-detector 222, or that reflected electrons are emitted on the way and remaining secondary electrons are projected. The multi-detector 222 includes a two-dimensional sensor (to be described later). Each secondary electron of the multiple secondary electron beams 300 collides with a corresponding region of the two-dimensional sensor so as to generate an electron and secondary electron image data for each pixel. In other words, in the multi-detector 222, a detection sensor is disposed for each primary electron beam i of the multiple primary electron beams 20, where i=1 to 529 in the case of the multiple primary electron beams 20 being composed of 23×23 beams. Then, the detection sensor detects a corresponding secondary electron beam emitted by irradiation with the primary electron beam i. Therefore, each of a plurality of detection sensors in the multi-detector 222 detects an intensity signal of a secondary electron beam for an image, which is resulting from irradiation with a corresponding primary electron beam 10. The intensity signal detected by the multi-detector 222 is output to the detection circuit 106.

Figure 3:
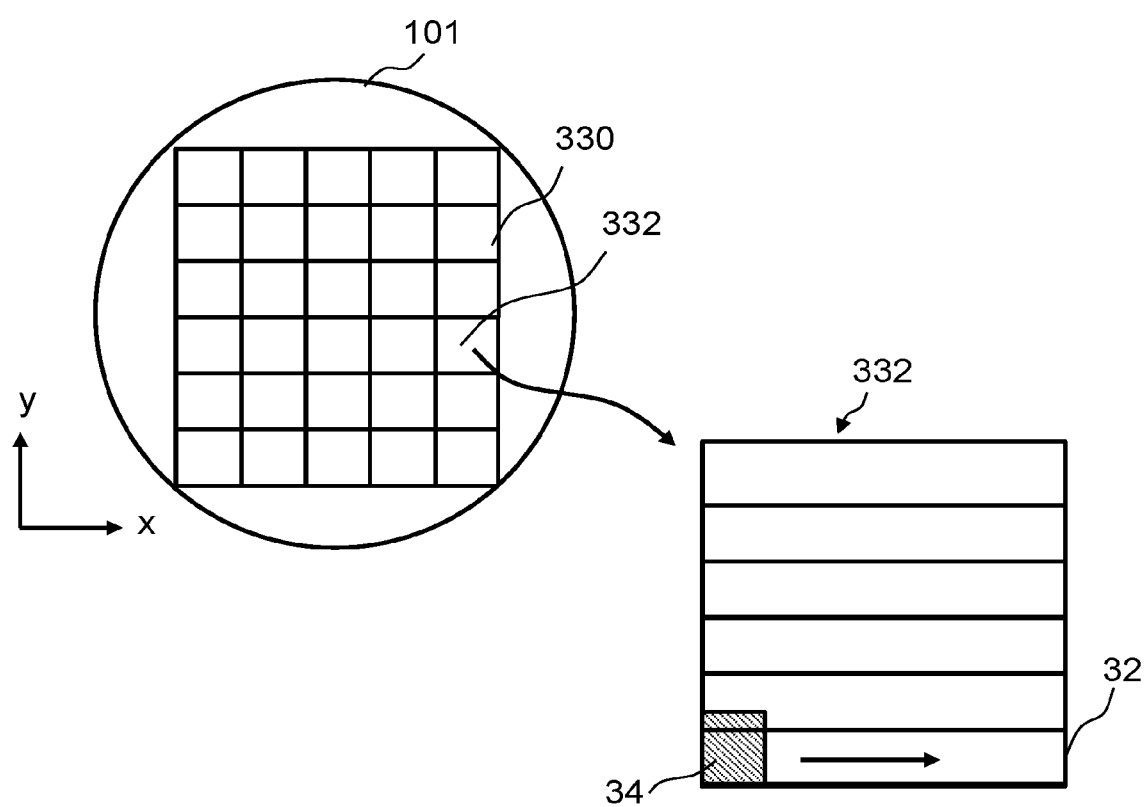
FIG. 3 shows an example of a plurality of chip regions formed on a semiconductor substrate, according to the first embodiment.

FIG. 3 shows an example of a plurality of chip regions formed on a semiconductor substrate, according to the first embodiment. In FIG. 3, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate is reduced to ¼, for example, and exposed/transferred onto each chip 332 by an exposure device (stepper) (not shown). The region of each chip 332 is divided into a plurality of stripe regions 32 by a predetermined width being in the y direction, for example. The scanning operation by the image acquisition mechanism 150 is carried out for each stripe region 32, for example. The operation of scanning the stripe region 32 advances relatively in the x direction while the stage 105 is moved in the −x direction, for example.

Figure 4:
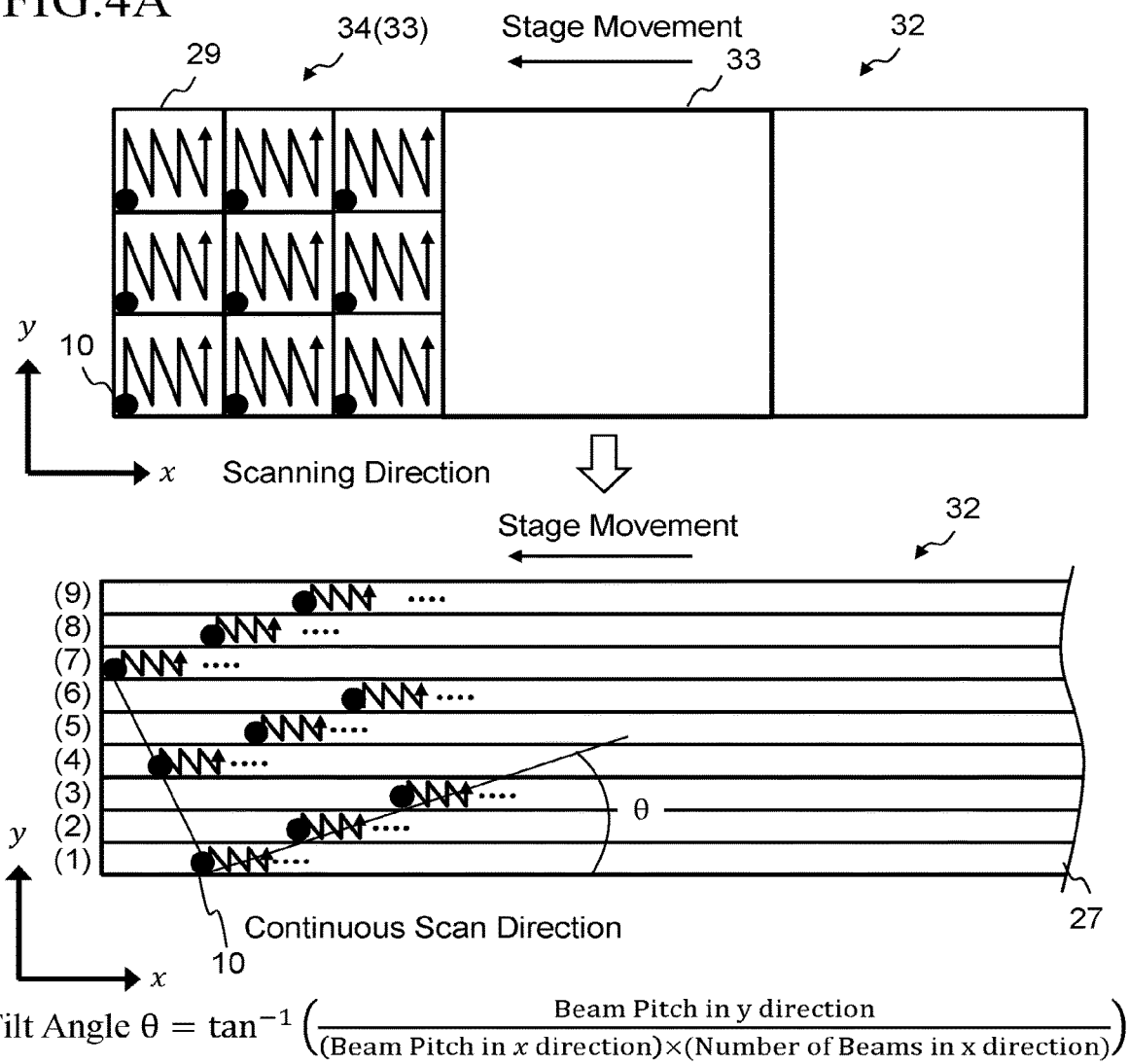
FIGS. 4A and 4B illustrate a scanning operation with multiple beams, where

FIGS. 4A and 4B illustrate a scanning operation with multiple beams, where FIG. 4A shows that according to a comparative example and FIG. 4B shows that according to the first embodiment. FIGS. 4A and 4B show the case of the multiple primary electron beams 20 of 3×3 (rows by columns). FIG. 4A shows a comparative example of the first embodiment, wherein the size of an irradiation region 34 that can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the example of FIG. 4A, each beam of the multiple primary electron beams 20 scans the inside of a sub-irradiation region 29 concerned surrounded by the beam pitch in the x direction and the beam pitch in the y direction where the beam concerned itself is located therein. For example, the scanning operation proceeds in the x direction being the scanning direction while repeating a line scanning in the y direction. Each primary electron beam 10 of the multiple primary electron beams 20 is associated with any one of the sub-irradiation regions 2 to 9 which are different from each other. At the time of each shot, each primary electron beam 10 is applied to the same position in the associated sub-irradiation region 29 concerned. The primary electron beam 10 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 10. Then, when scanning of one sub-irradiation region 29 is completed, the irradiation position is moved to a rectangular (including square) region 33, which is the same size as the irradiation region 34, in the same stripe region 32 by collectively deflecting all the multiple primary electron beams 20 by the main deflector 208. By repeating this operation, the inside of the stripe region 32 is irradiated in order. In this scanning operation, each region is scanned only once by any one of the beams. However, if this operation is continued, difference is generated among acquired images due to difference of a noise component of each beam. Then, for example, according to a comparative example, after scanning one sub irradiation region 29, the sub irradiation region 29 adjacent in the x direction, for example, is scanned by continuously moving the stage 105. By this, the same position can be overlappingly scanned by three beams aligned in the x direction. Thereby, the image of the same region can be overlappingly obtained by different three beams without repeatedly scanning the same line a plurality of times. Then, averaging (equalization) can be performed by overlapping three images of the same region. Therefore, averaging can be performed for images obtained a plurality of times being the same number as the number of beams aligned in the x direction. However, according to this method, the frequency (the number of times) used for averaging (hereinafter, sometimes referred as an averaging frequency) is always limited to the number of beams aligned in the x direction. Therefore, depending on conditions, image averaging may be performed based on the number which is more than needed or less than needed. Accordingly, it is desirable to arbitrarily set the frequency (the number of times) used for averaging. Further, according to this method, the region located at the end (boundary) of an image, which is obtained by each beam, is always located at the end (boundary) of the images even obtained by the other two beams aligned in the x direction. Therefore, since image boundaries are always overlapped with each other even in the case of averaging, difference (deviation) occurs easily at the connecting portion (boundary)) of adjacent images.

Then, according to the first embodiment, as shown in FIG. 4B, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. For example, the arrangement angle of the shaping aperture array substrate 203 is rotated to shift them from each other. Alternatively, the moving direction of the stage 105 is adjusted to be oblique instead of the −x direction, for example. Alternatively, it is also preferable to rotate the multiple primary electron beam image on the substrate 101 by using the electrostatic lens 215. The tilt angle θ (rad) can be defined by the following equation (1) using a value obtained by dividing the beam pitch in the y direction of the multiple primary electron beams 20 by a value obtained by multiplying the beam pitch in the x direction by the number of beams in the x direction.

$$\theta = \tan^{-1}(\text{beam pitch in } y \text{ direction}/(\text{beam pitch in } x \text{ direction} \times \text{the number of beams in } x \text{ direction})) \quad (1)$$

In the example of FIG. 4B, a plurality of the primary electron beams 10 of the multiple primary electron beams 20 can be arranged not to be parallel to the moving direction of the stage 105 by rotating the arranging direction of the multiple primary electron beams 20 of 3×3 (rows by columns) on the substrate 101 by the tilt angle θ. Thereby, an individual scan region 27 to be scanned by each primary electron beam 10 can be set, as shown in FIG. 4B, on the substrate 101 which extends in parallel to the moving direction of the stage 105. In the case of the multiple primary electron beams 20 of 3×3 (rows by columns), the individual scan region 27 can be set for each of the beams 1 to 9. In FIG. 4B, the stripe region 32 in the x direction is divided into nine individual scan regions 27(1) to (9) in a strip form by the same width in the y direction. Referring to FIG. 4B, description is given on the basis that there are n primary electron beams 10 each of which scans the individual scan region 27 (n) of a certain stripe region 32 (n being an integer from 1 to 9). Then, if the scan region width to be scanned by each primary electron beam 10 is the same as the width of the individual scan region 27, which results in that each beam individually acquires an image of a separate region, thereby being impossible to perform averaging. According to the first embodiment, the scan region width to be scanned by each primary electron beam 10 is set variably.

Figure 5:
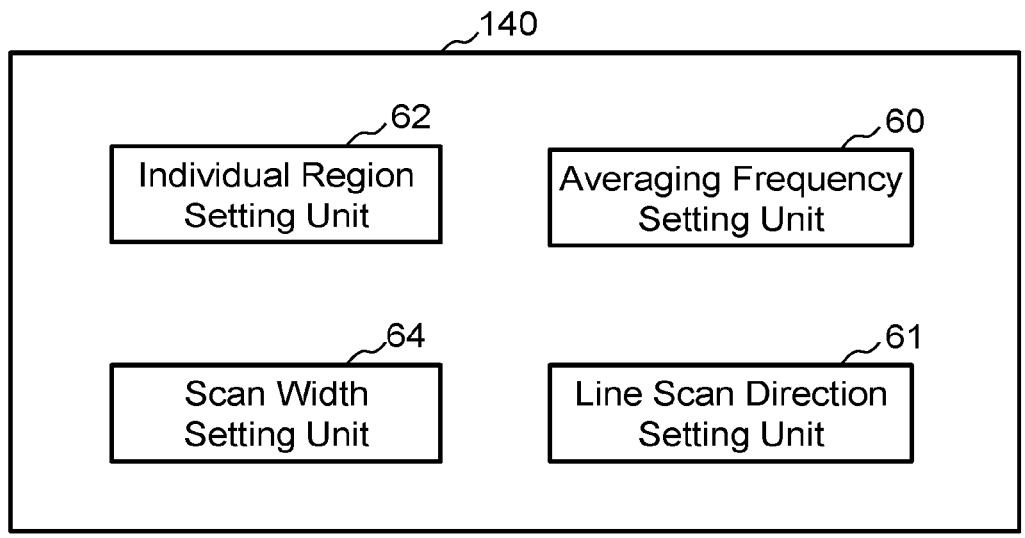
FIG. 5 shows an example of an internal configuration of a scan region setting circuit according to the first embodiment.

FIG. 5 shows an example of an internal configuration of the scan region setting circuit 140 according to the first embodiment. In FIG. 5, in the scan region setting circuit 140, there are arranged an averaging frequency setting unit 60, a line scan direction setting unit 61, an individual region setting unit 62, and a scan width setting unit 64. Each of the "units" such as the averaging frequency setting unit 60, the line scan direction setting unit 61, the individual region setting unit 62, and the scan width setting unit 64 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the averaging frequency setting unit 60, the line scan direction setting unit 61, the individual region setting unit 62, and the scan width setting unit 64, and calculated results are stored in a memory (not shown) or in the memory 118 each time.

Figure 6:
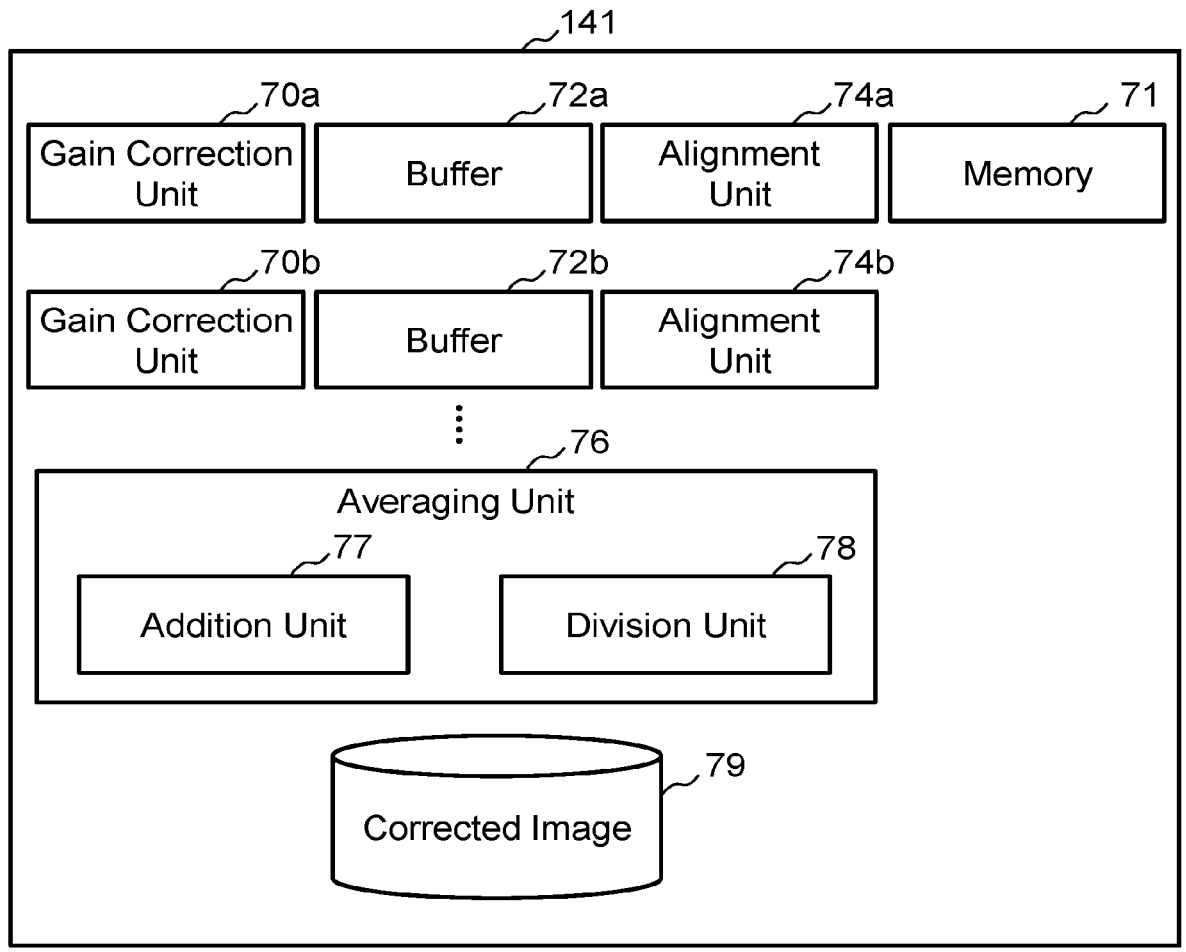
FIG. 6 shows an example of an internal configuration of a correction circuit according to the first embodiment.

FIG. 6 shows an example of an internal configuration of the image correction circuit 141 according to the first embodiment. In FIG. 6, in the image correction circuit 141, there are arranged a memory 71, a plurality of gain correction units 70 (a to n) corresponding to the number of beams of the multiple primary electron beams 20, a plurality of buffers 72 (a to n) corresponding to the number of beams, a plurality of alignment units 74 (a to n) corresponding to the number of beams, an averaging unit 76, and a storage devices 79, such as a magnetic disk drive for storing a corrected image. In the averaging unit 76, there are arranged an addition unit 77 and a division unit 78. Each of the "units" such as a plurality of gain correction units 70 (a to n), a plurality of buffers 72 (a to n), a plurality of alignment units 74 (a to n), and the averaging unit 76 (the addition unit 77 and the division unit 78) includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in a plurality of gain correction units 70(a to n), a plurality of buffers 72 (a to n), a plurality of alignment units 74 (a to n), and the averaging unit 76 (the addition unit 77 and the division unit 78), and calculated results are stored in the memory 71 or the memory 118 in FIG. 1 each time. As for a plurality of gain correction units 70, it is desirable to dispose them, but they may be omitted.

Figure 7:
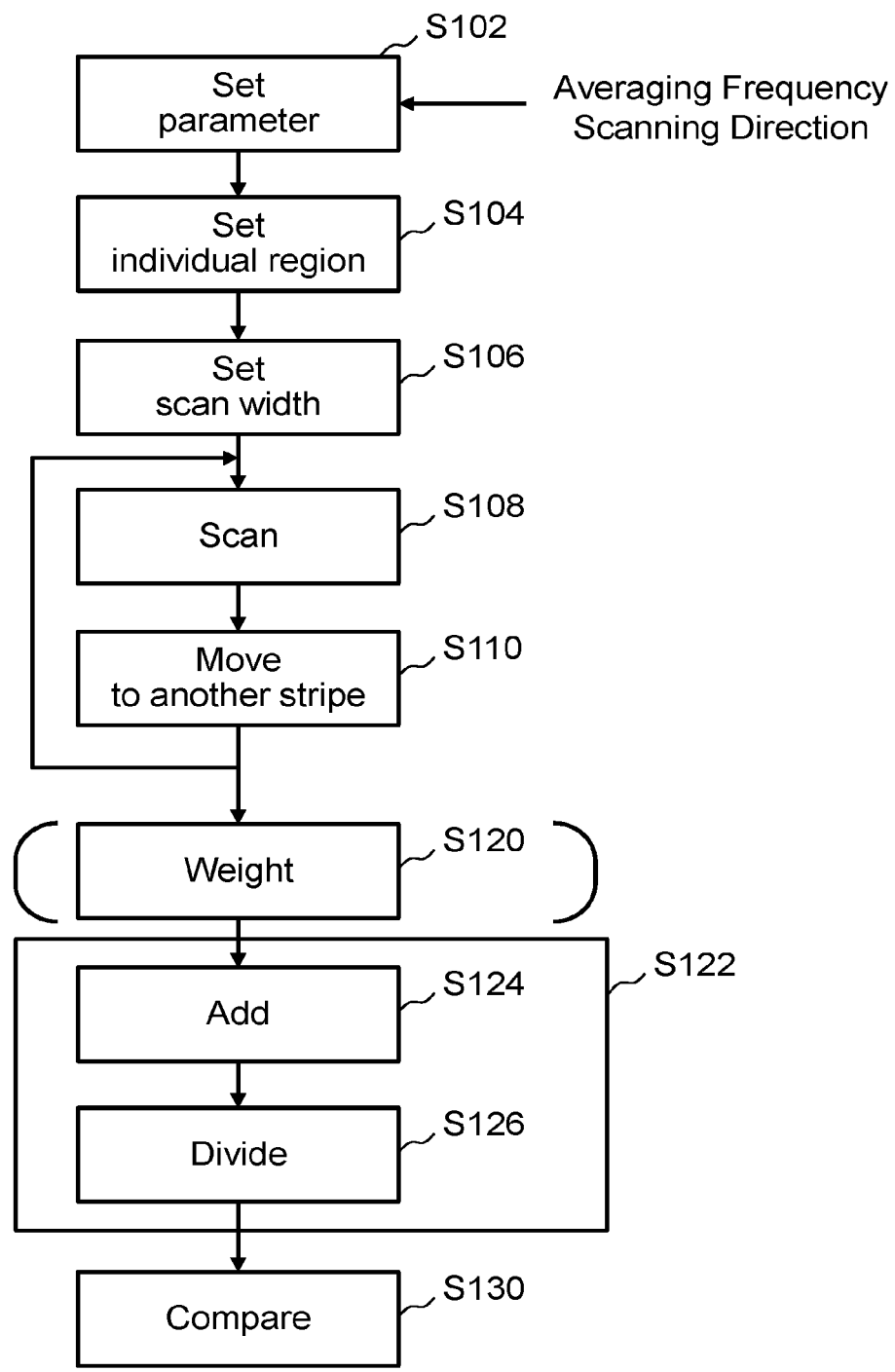
FIG. 7 is a flowchart showing main steps of an example of an inspection method according to the first embodiment.

FIG. 7 is a flowchart showing main steps of an example of an inspection method according to the first embodiment. In FIG. 7, the inspection method of the first embodiment executes a series of steps: a parameter setting step (S102), an individual region setting step (S104), a scan width setting step (S106), a scanning step (S108), a moving in stripe-regions step (S110), a weighting step (S120), an averaging step (S122), and a comparison step (S130). The averaging step (S122) carries out an addition step (S124) and a division step (S126) as internal steps. As for the weighting step (S120), it is desirable to dispose it, but it may be omitted.

In the parameter setting step (S102), the averaging frequency setting unit 60 sets, as one of parameters, an image averaging frequency (that is, the frequency (the number of times) used for image averaging). The image averaging frequency (the number of times) can be variably set from one to the number of beams of the multiple primary electron beams 20. However, in the case of the image averaging frequency being one, since it does not change from the original image, it cannot be said that this state has been averaged. Therefore, here, it is variably set from two to the number of beams of the multiple primary electron beams. For example, if the multiple primary electron beams 20 of 3×3 can be applied, the image averaging frequency can be variably set from two to nine. Moreover, the line scan direction setting unit 61 sets, as another parameter, the line scan direction of each beam. Here, as shown in FIG. 4B, the line scan direction of each beam is set to be the y direction, for example, without shifting (rotating) it by the tilt angle θ.

In the individual region setting step (S104), the individual region setting unit 62 sets the individual scan region 27 of each beam on the substrate 101 which extends in parallel to the moving direction of the stage 105, by relatively shifting the angle of the moving direction of the stage 105 and the angle of the array arranging direction of multiple primary electron beams from each other. In FIG. 4B, the stripe region 32 in the x direction is divided into nine individual scan regions 27(1) to (9) in a strip form by the same width in the y direction.

In the scan width setting step (S106), the scan width setting unit 64 variably sets the scan region width (individual beam scan width) of each beam so that the individual scan regions 27 of other beams may be included in the direction perpendicular to the moving direction of the stage 105. The scan width setting unit 64 sets the scan region width to be scanned by each primary electron beam 10 of the multiple primary electron beams 20 to be variable correspondingly depending on the image averaging frequency which can be set variably. In other words, depending on (corresponding to) the frequency used for image averaging, the scan region width in the y direction of each primary electron beam 10 is expanded. When the frequency used for image averaging is nine which is the maximum number of beams of the multiple primary electron beams 20, the scan region width in the y direction of each primary electron beam 10 needs to be equivalent to the width of nine individual scan regions 27 so as to be scanned. Thus, it is necessary for each primary electron beam 10 to scan at least this width (the width of nine individual scan regions 27).

Figure 8:
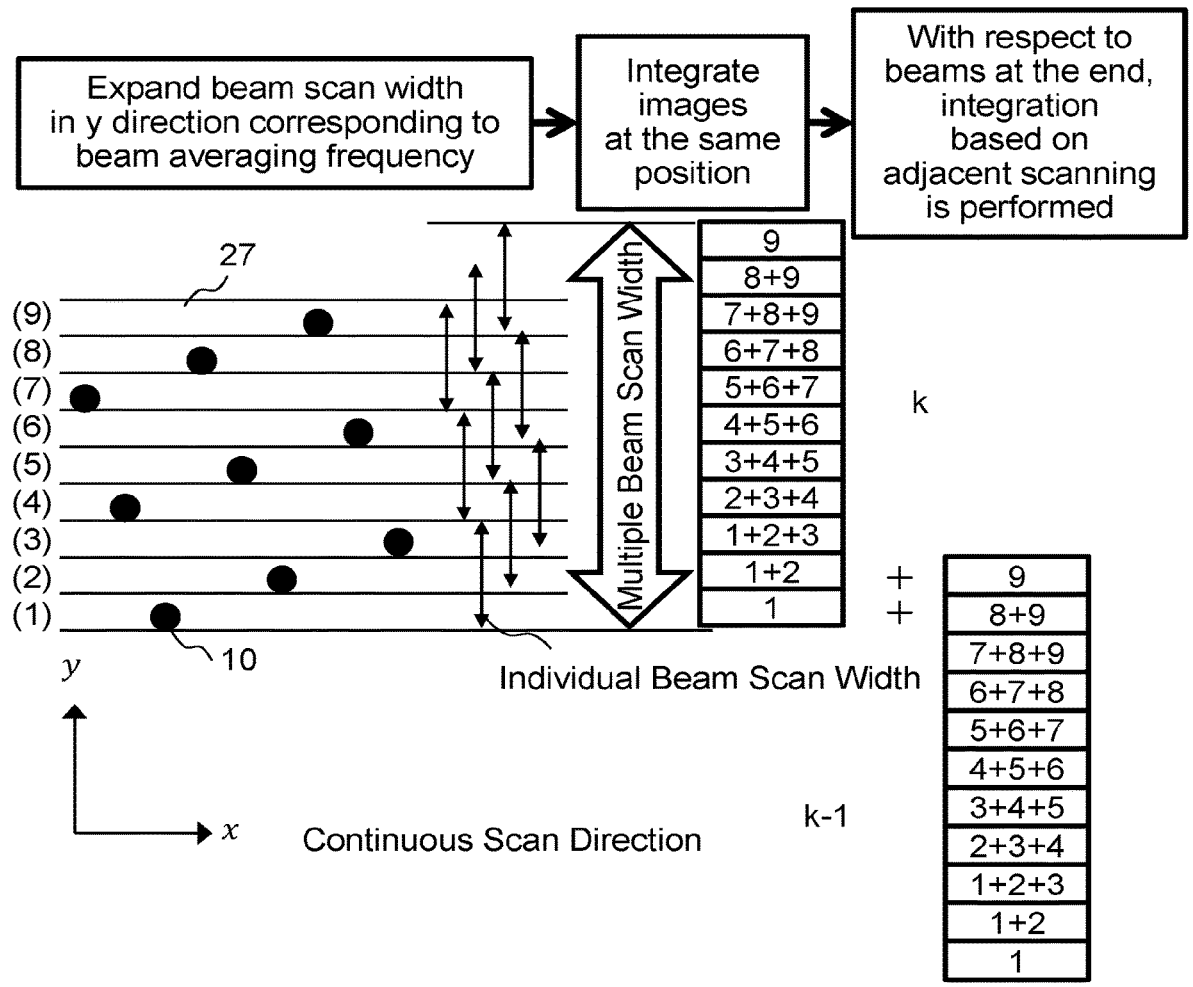
FIG. 8 illustrates an example of a scan width of each beam, and an example of averaging processing according to the first embodiment.

FIG. 8 illustrates an example of a scan width of each beam, and an example of averaging processing according to the first embodiment. FIG. 8 shows the case of using the multiple primary electron beams 20 of 3×3 and the image averaging frequency being three. When the image averaging frequency (that is, the frequency used for image averaging) is three, the scan width (individual beam scan width) of each primary electron beam 10 is set to be the width in the y direction of the total of three individual scan regions 27 including the individual scan region 27 currently concerned and two adjacent individual scan regions 27 of the primary electron beam 10. In the example of FIG. 8, the scan width of each primary electron beam 10 is set to be the width in the y direction of the total of three individual scan regions 27 including the individual scan region 27 currently concerned, the second individual scan region 27, being adjacent in the y direction, and the third individual scan region 27, being further in the y direction. Therefore, the beam 1 scans three individual scan regions 27(1) to (3) of the k-th stripe region 32. The beam 2 scans three individual scan regions 27(2) to (4) of the k-th stripe region 32. The beam 3 scans three individual scan regions 27(3) to (5) of the k-th stripe region 32. The beam 4 scans three individual scan regions 27(4) to (6) of the k-th stripe region 32. The beam 5 scans three individual scan regions 27(5) to (7) of the k-th stripe region 32. The beam 6 scans three individual scan regions 27(6) to (8) of the k-th stripe region 32. The beam 7 scans three individual scan regions 27(7) to (9) of the k-th stripe region 32. The beam 8 scans three individual scan regions 27(8), (9), and (1) which are two individual scan regions 27(8) and (9) of the k-th stripe region 32, and one individual scan region 27(1) of the (k+1)th stripe region 32. The beam 9 scans three regions 27(9), (1), and (2) which are one individual scan region 27(9) of the k-th stripe region 32, and two individual scan regions 27(1) and (2) of the (k+1)th stripe region 32. Therefore, the scan width (multiple beam scan width) of the whole of the multiple primary electron beams 20 is the width in the y direction of the total of eleven individual scan regions 27 which are obtained by adding the width of the stripe region 32 concerned and two individual scan regions 27 of the next stripe region 32.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105.

For acquiring an image, as described above, the multiple primary electron beams 20 are applied to the substrate 101 so that the multi-detector 222 may detect the multiple secondary electron beams 300 emitted from the substrate 101 by the irradiation with the multiple primary electron beams 20. Detected data (measured image data: secondary electron image data: inspection image data) on a secondary electron of each beam detected by the multi-detector 222 is output to the detection circuit 106 in order of measurement. In the detection circuit 106, the detected data in analog form is converted into digital data by an A-D converter (not shown), and stored in the chip pattern memory 123. Then, acquired measured image data is transmitted to the image correction circuit 141, together with information on each position from the position circuit 107. As shown in FIG. 8, by scanning with each beam, image data for each of three individual scan regions 27 is output to the image correction circuit 141 per one beam scanning.

In the moving in stripe-regions step (S110), after completing scanning one stripe region 32, the stage 105 is moved to the starting position of the next scanning operation in the adjacent next stripe region 32. Then, it returns to the scanning step (S108) to perform a scanning operation similarly.

Thereby, as shown in FIG. 8, by the operation of scanning the k-th stripe region 32, image data (secondary electron image data) in the individual scan region (1) of the k-th stripe region 32 is acquired by the scanning with the beam 1. Image data in the individual scan region (2) of the k-th stripe region 32 is overlappingly acquired by the scanning with the beams 1 and 2. Image data in the individual scan region (3) of the k-th stripe region 32 is overlappingly acquired by the scanning with the beams 1 to 3. Image data in the individual scan region (4) of the k-th stripe region 32 is overlappingly acquired by the scanning with the beams 2 to 4. Image data in the individual scan region (5) of the k-th stripe region 32 is overlappingly acquired by the scanning with the beams 3 to 5. Image data in the individual scan region (6) of the k-th stripe region 32 is overlappingly acquired by the scanning with the beams 4 to 6. Image data in the individual scan region (7) of the k-th stripe region 32 is overlappingly acquired by the scanning with the beams 5 to 7. Image data in the individual scan region (8) of the k-th stripe region 32 is overlappingly acquired by the scanning with the beams 6 to 8. Image data in the individual scan region (9) of the k-th stripe region 32 is overlappingly acquired by the scanning with the beams 7 to 9. Image data in the individual scan region (1) of the (k+1)th stripe region 32 is overlappingly acquired by the scanning with the beams 8 and 9. Image data in the individual scan region (2) of the (k+1)th stripe region 32 is overlappingly acquired by the scanning with the beam 9.

Therefore, as shown in FIG. 8, in each of the individual scan regions 27(3) to (9), three pieces of image data are obtained overlappingly with three beams. By performing the operation of scanning the k-th stripe region 32, only one image data by one beam can be obtained with respect to the individual scan region (1) of the k-th stripe region 32. Similarly, by the operation of scanning the k-th stripe region 32, only two pieces of image data by two beams can be obtained with respect to the individual scan region (2) of the k-th stripe region 32. However, by performing the operation of scanning the (k−1)th stripe region 32, two pieces of image data by two beams have already been overlappingly obtained with respect to the individual scan region (1) of the k-th stripe region 32. Similarly, by the operation of scanning the (k−1)th stripe region 32, one image data by one beam has already been obtained with respect to the individual scan region (2) of the k-th stripe region 32. Thus, insufficient image data for the individual scan region 27 at the end of each stripe region 32 can be acquired by the operation of scanning the adjacent (prior) stripe region 32. Accordingly, three pieces of image data can be overlappingly obtained with respect to each of all the individual scan regions 27.

In the averaging step (S122), using image data of each beam, the averaging unit 76 in the image correction circuit 141 averages errors of the image data by superimposing image data of the same position at the number being the same as that indicated by an image averaging frequency having been set. Specifically, the image data of each beam is stored in the buffer 72 for each beam. When the same individual scan region 27 is scanned by a plurality of beams, since a time difference occurs in scanning time, the image data of each beam is temporarily stored in the buffer 72. Then, the image data is output to the alignment unit 74 for each beam. The alignment unit 74 for each beam provides alignment with image data of other beams which scanned the same individual scan region 27. Specifically, deviation in the y direction is corrected. Then, each image data whose alignment has been performed is output to the averaging unit 76. In the averaging unit 76, in the addition step (S124), the addition unit 77 adds (integrates) gray-scale level values of image data of the same position at the number being the same as that indicated by the image averaging frequency having been set. Then, in the division step (S126), the division unit 78 divides the added gray-scale level values of the image data by the image averaging frequency (the number of times). In the example of FIG. 8, since three pieces of image data have been acquired for each individual scan region 27, the addition unit 77 adds (integrates) these image data, and then, the division unit 78 divides the added image data by three. Thereby, it is possible to obtain an image which has been averaged by using the image averaging frequency being three. Although, here, after performing the addition, the division is performed using the image averaging frequency, it is not limited thereto. It is also preferable to perform only addition. The averaged image data of each individual scan region 27 is output to the comparison circuit 108.

Regarding each individual scan region 27, three pieces of image data can be acquired. Specifically, image data of one individual scan region 27 located at the end of three individual scan regions 27 scanned by one beam, image data of another individual scan region 27 located in the center of the three individual scan regions 27 scanned by the one beam, and image data of another individual scan region 27 located at the other end of the three individual scan regions 27 scanned by the one beam. For example, in the individual scan region (3), it is possible to acquire three pieces of image data scanned at different scanning positions, that is, the image data scanned by the beam 1 at one end of the scan region width, the image data scanned by the beam 2 at the center of the scan region width, and the image data scanned by the beam 3 at the other end of the scan region width. In other words, with respect to image data to be combined, the beam connecting portion can be distributed (decentralized).

Thus, difference due to deviation of gray-scale level values at the beam connecting portion (image boundary) between mutually adjacent individual scan regions 27 is unlikely to occur. Accordingly, compared to the case of averaging using data at the image boundary performed at the position of the image boundary shown in FIG. 4A, according to the first embodiment, since the three pieces of image data at different scanning positions are integrated, the influence of difference due to deviation of gray-scale level values at the beam connecting portion (boundary)) between mutually adjacent individual scan regions 27 can be reduced.

Figures 9A, 9B:
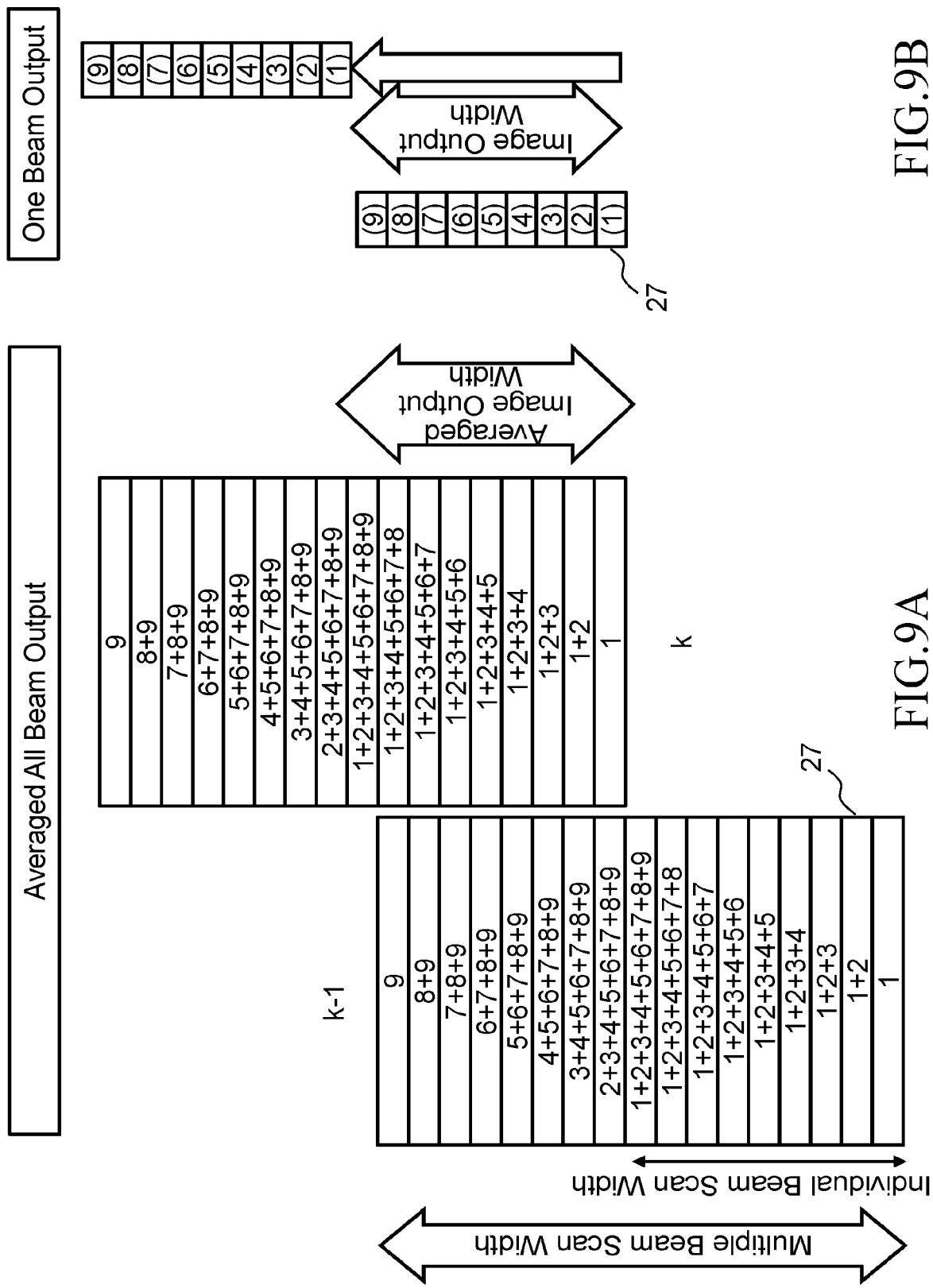
FIGS. 9A and 9B illustrate another example of a scan width of each beam, and an example of averaging processing according to the first embodiment.

FIGS. 9A and 9B illustrate another example of a scan width of each beam, and an example of averaging processing according to the first embodiment. FIGS. 9A and 9B show the case of using the multiple primary electron beams 20 of 3×3 and the image averaging frequency being nine. When the image averaging frequency (that is, the frequency used for image averaging) is nine, the scan width (individual beam scan width) of each primary electron beam 10 is set to be the width in the y direction of the total of nine individual scan regions 27 including the individual scan region 27 currently concerned and eight individual scan regions 27, each adjacent in the y direction, of the primary electron beam 10. Therefore, as shown in FIG. 9A, when scanning the k-th stripe region 32, the beam 1 scans nine individual scan regions 27(1) to (9) of the k-th stripe region 32. The beam 2 scans eight individual scan regions 27(2) to (9) of the k-th stripe region 32 and one individual scan region 27(1) of the (k+1)th stripe region 32. The beam 3 scans seven individual scan regions 27(3) to (9) of the k-th stripe region 32 and two individual scan regions 27(1) and (2) of the (k+1)th stripe region 32. The beam 4 scans six individual scan regions 27(4) to (9) of the k-th stripe region 32 and three individual scan regions 27(1) to (3) of the (k+1)th stripe region 32. The beam 5 scans five individual scan regions 27(5) to (9) of the k-th stripe region 32 and four individual scan regions 27(1) to (4) of the (k+1)th stripe region 32. The beam 6 scans four individual scan regions 27(6) to (9) of the k-th stripe region 32 and five individual scan regions 27(1) to (5) of the (k+1)th stripe region 32. The beam 7 scans three individual scan regions 27(7) to (9) of the k-th stripe region 32 and six individual scan regions 27(1) to (6) of the (k+1)th stripe region 32. The beam 8 scans two individual scan regions 27(8) and (9) of the k-th stripe region 32 and seven individual scan regions 27(1) to (7) of the (k+1)th stripe region 32. The beam 9 scans one individual scan region 27(9) of the k-th stripe region 32 and eight individual scan regions 27(1) to (8) of the (k+1)th stripe region 32. Therefore, the scan width (multiple beam scan width) of the whole of the multiple primary electron beams 20 is the width in the y direction of the total of eighteen individual scan regions 27 which are obtained by adding the width of the stripe region 32 concerned and nine individual scan regions 27 of the next stripe region 32. In other words, the scan width (multiple beam scan width) of the whole of the multiple primary electron beams 20 is the width in the y direction of two stripe regions 32. As shown in FIG. 9B, image data of nine individual scan regions 27 by each one beam scanning is output to the image correction circuit 141.

Therefore, as shown in FIGS. 9A and 9B, in each individual scan regions 27, nine pieces of image data are overlappingly obtained with nine beams. With respect to each individual scan region 27 of the k-th stripe region 32, insufficient image data which cannot be obtained by scanning the k-th stripe region 32 can be compensated by being combined with image data obtained by scanning the (k−1)th stripe region 32. This relation is satisfied in the case of setting the image averaging frequency to be any one from two to the number of beams of the multiple primary electron beams.

Using image data of each beam, the averaging unit 76 in the image correction circuit 141 averages errors of the image data by superimposing image data of the same position at the number being the same as that indicated by an image averaging frequency having been set. In the case of FIGS. 9A and 9B, since nine pieces of image data have been acquired for each individual scan region 27, the addition unit 77 adds (integrates) these image data, and then, the division unit 78 divides the added image data by nine. Thereby, it is possible to obtain an image which has been averaged by using the image averaging frequency being nine. The averaged image data of each individual scan region 27 is output to the comparison circuit 108.

Although the above examples describe the case where each beam performs a scanning operation whose line scan direction is the y direction, it is not limited thereto.

Figure 10C:
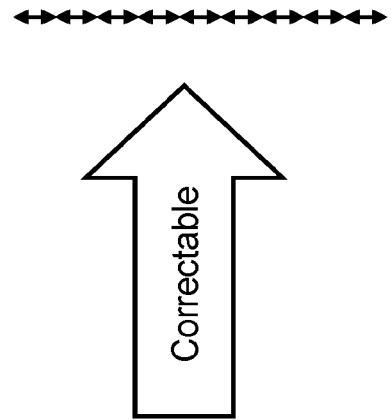
FIGS. 10A to 10C illustrate a relation between a line scan direction of each beam and an obtained image according to the first embodiment.
Figure 10B:
Figure 10A:
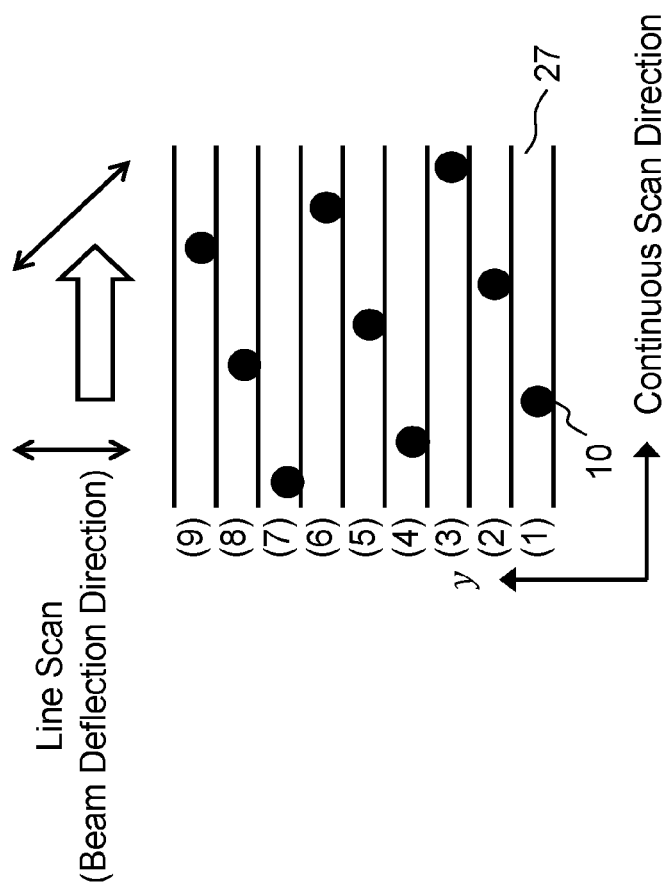

FIGS. 10A to 10C illustrate a relation between a line scan direction of each beam and an obtained image according to the first embodiment. FIG. 10A shows the case where the multiple primary electron beams 20 of 3×3 are used. The arranging direction of the multiple primary electron beams 20 is rotated by the tilt angle θ with respect to the moving direction of the stage 105. If setting the line scan direction of each primary electron beam 10 to be the y direction to perform line scanning, images arranged in the y direction are obtained as shown in FIG. 10C. On the other hand, if setting the line scan direction of each primary electron beam 10 to be the direction rotated by 45 degrees from the y direction to perform line scanning, images arranged in the direction rotated by −45 degrees from the y direction as shown in FIG. 10B are obtained due to a time delay corresponding to the order of measurement of each pixel. However, as shown in FIG. 10C, the images can be straightly aligned in the y direction by performing position correction. Therefore, the line scan direction of each primary electron beam 10 may be set arbitrarily, not restricted to the y direction. For example, since the arranging direction of the multiple primary electron beams 20 has been shifted by the tilt angle θ with respect to the moving direction of the stage 105, the line scan direction can also be shifted from the y direction by the tilt angle θ.

Figure 11:
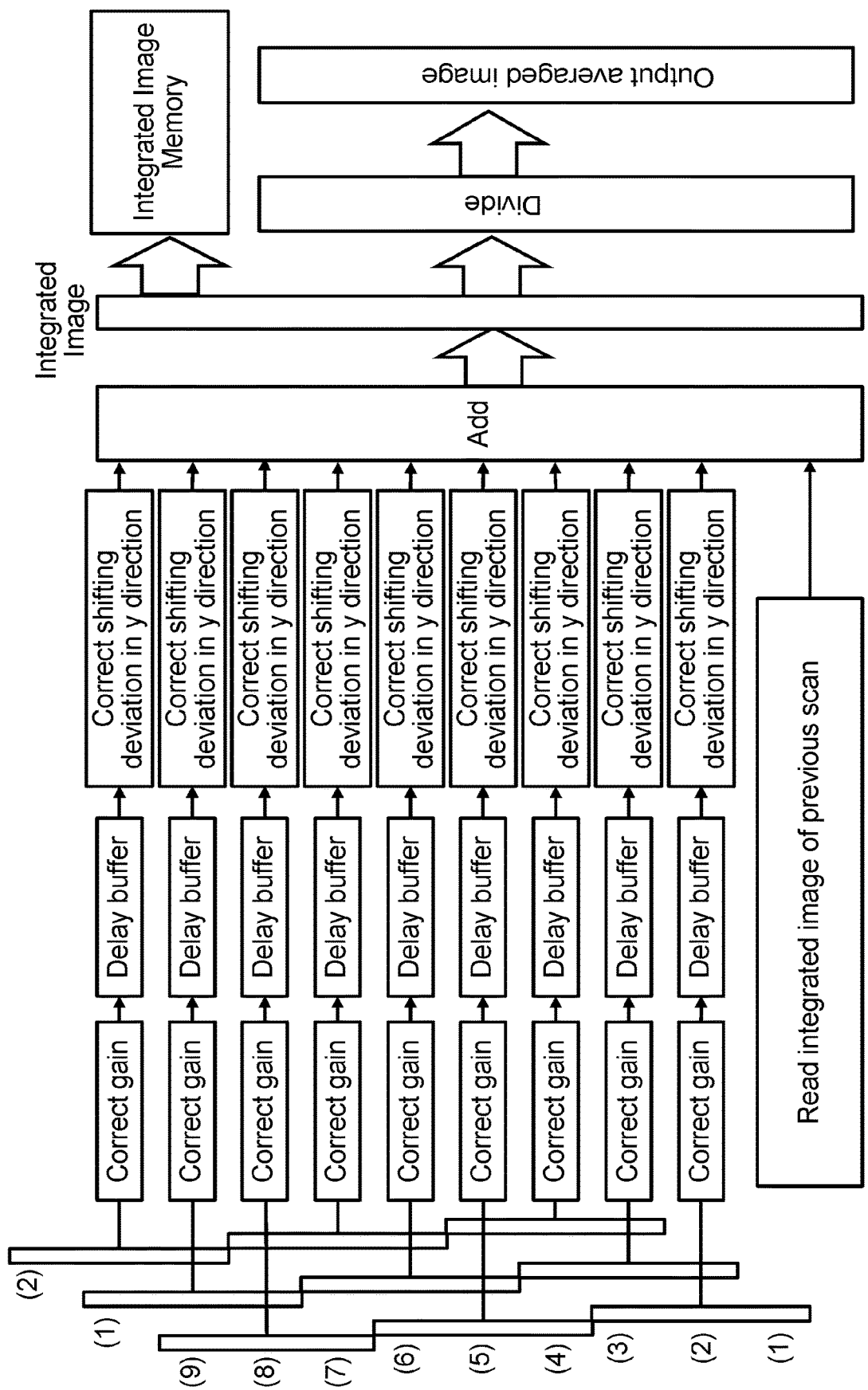
FIG. 11 shows another example of the contents of averaging processing according to the first embodiment.

FIG. 11 shows another example of the contents of averaging processing according to the first embodiment. FIG. 11 shows the case in which weighting processing by the gain correction unit 70 is further carried out in the weighting step (S120). In the image correction circuit 141, a group of the gain correction unit 70, the buffer 72, and the alignment unit 74 is arranged for each primary electron beam 10. As shown in FIG. 8, when the image averaging frequency (that is, the number of times used for image averaging) is three, image data of each pixel in the individual scan regions (1) to (3) is included in the image data scanned by the beam 1. Similarly, image data of each pixel in the individual scan regions (2) to (4) is included in the image data scanned by the beam 2. Similarly, image data scanned by each of the beams 3 to 9 includes image data of each pixel in the total of three individual scan regions which are the individual scan region 27 currently concerned and two contiguous individual scan regions. Then, the image data obtained with each beam is output to the image correction circuit 141, and input to the gain correction unit 70 for each beam.

In the weighting step (S120), the gain correction unit 70 for each beam applies weighting to the input image data of the three individual scan regions.

Figure 12:
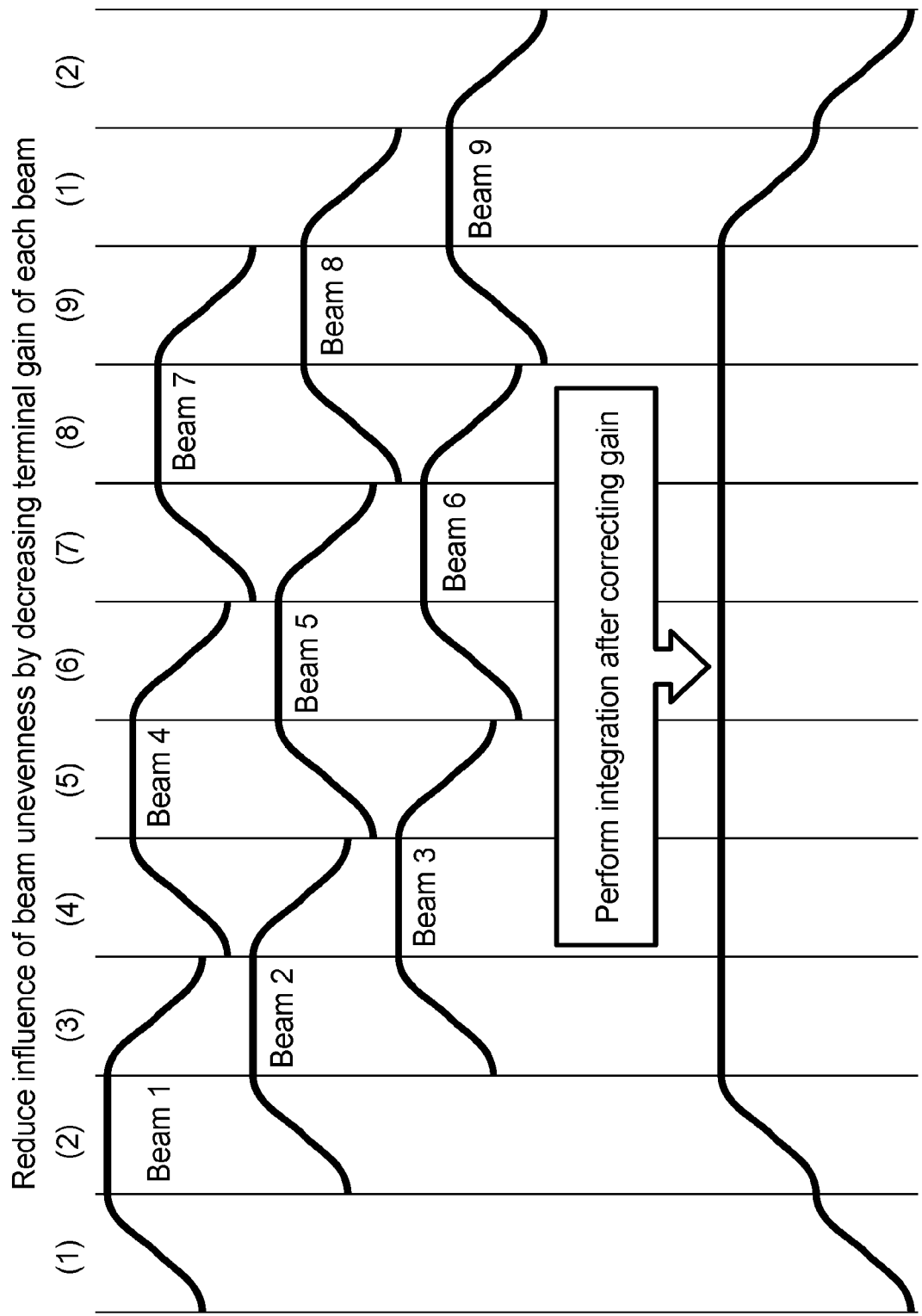
FIG. 12 illustrates weighting processing according to the first embodiment.

FIG. 12 illustrates weighting processing according to the first embodiment. As shown in FIG. 12, the gain correction unit 70 for each beam applies weighting to the input image data of the three individual scan regions so that gray-scale level values of image data of the two individual scan regions at the both sides in the three individual scan regions may become smaller toward the end. Specifically, gain adjustment is performed so that a gain of a terminal end may be reduced. Deviation at the connecting portion of an image can be reduced or eliminated by making the weighting at the end portion small. In other words, the influence of beam difference can be reduced by decreasing the gain of the terminal end of each beam. The image data of each beam, for which the gain adjustment has been performed, is temporarily stored in the buffer 72 for each beam. Then, after image data of the same individual scan region have been prepared, the alignment unit 74 for each beam adjusts deviation in the y direction, and the image data of each beam is output to the averaging unit 76. In the averaging unit 76, by integrating the image data of the same individual scan region by the addition unit 77, deviation of the gray scale level at the connecting portion of each individual scan region after the integration can be eliminated as shown in FIG. 12. Similarly, in the subsequent process, when the division unit 78 performs division by three, an image which has been averaged at the image averaging frequency being three can be obtained. The averaged image data of each individual scan region 27 is output to the comparison circuit 108.

In the comparison step (S130), the comparison circuit 108 compares averaged image data of each individual scan region 27 with a reference image. Prior to this, the reference image has been generated.

In the reference image generation step, the reference image generation circuit 112 generates a reference image for each rectangular region 33, based on design data serving as a basis of a plurality of figure patterns formed on the substrate 101. Specifically, it operates as follows: First, design pattern data is read from the storage device 109 through the control computer 110, and each figure pattern defined in the read design pattern data is converted into image data of binary or multiple values.

Basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as the figure data is input to the reference image generation circuit 112, the data is developed into data of each figure. Then, the figure code, the figure dimensions, and the like indicating the figure shape of each figure data are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8$ ($=1/256$), the occupancy in each pixel is calculated by allocating small regions which correspond to the region of figures arranged in the pixel concerned and each of which corresponds to 1/256 resolution. Then, the occupancy is generated as 8-bit occupancy data. The square region (inspection pixel) can be in accordance with the pixel of measured data.

Next, the reference image generation circuit 112 performs filtering processing on design image data of a design pattern which is image data of a figure, using a predetermined filter function. Thereby, it is possible to match/fit the design image data being image data on the design side, whose image intensity (gray scale level) is represented by digital values, with image generation characteristics obtained by irradiation with the multiple primary electron beams 20. The generated image data for each pixel of a reference image is output to the comparison circuit 108.

Figure 13:
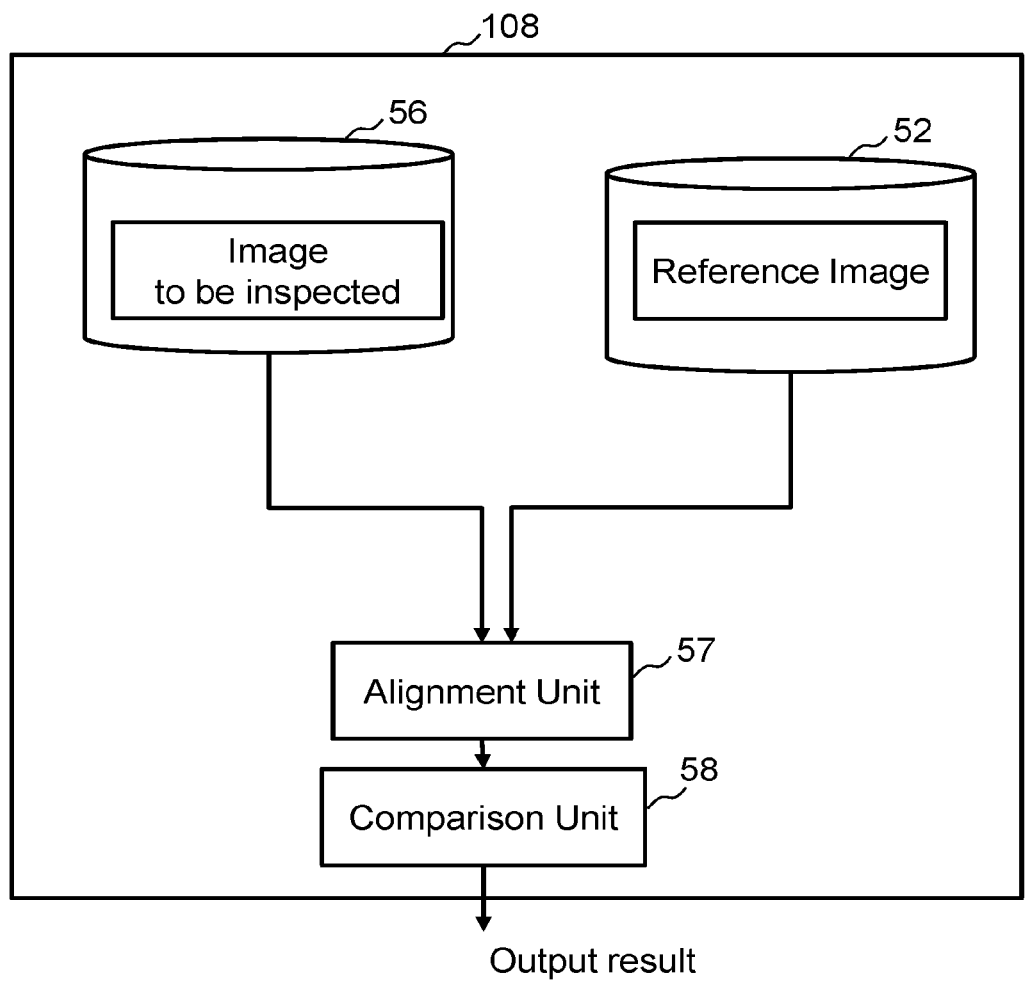
FIG. 13 shows an example of an internal configuration of a comparison circuit according to the first embodiment.

FIG. 13 shows an example of an internal configuration of a comparison circuit according to the first embodiment. In FIG. 13, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the alignment unit 57 and the comparison unit 58, and calculated results are stored in a memory (not shown) or in the memory 118 each time.

According to the first embodiment, the stripe region 32 is further divided into a plurality of rectangular (including square) frame regions. The frame region is used as a unit region of an image to be inspected. In order to prevent missing an image, it is preferable that the margin region of each frame region overlaps each other. Also, it is preferable that each of the size in the x direction and that in the y direction of the frame region is set to be around an integer fraction (e.g., about ½) of the beam pitch of the multiple primary electron beams 20 on the substrate 101 when the arrangement of the multiple primary electron beams 20 is in the x and y directions, without being rotated to be oblique, for example.

In the comparison circuit 108, transmitted secondary electron image data is temporarily stored in the storage device 56, as a secondary electron image (inspection image to be inspected, frame image) of each frame region. Similarly, transmitted reference image data is temporarily stored in the storage device 52, as a reference image for each frame region.

In the alignment step, the alignment unit 57 reads, for each frame region, a frame image serving as an inspection image, and a reference image corresponding to the frame image, and provides alignment between both the images, based on units of sub-pixels smaller than units of pixels. For example, the alignment can be performed by a least-square method.

In the comparison step, the comparison unit 58 compares the frame image (secondary electron image) and the reference image. In other words, the comparison unit 58 compares, for each pixel, reference image data with frame image data. The comparison unit 58 compares them, for each pixel, based on predetermined determination conditions in order to determine whether there is a defect such as a shape defect. For example, if a gray scale level difference in each pixel is larger than a determination threshold Th, it is determined that there is a defect. Then, the comparison result is output.

It may be output specifically to the storage device 109, the monitor 117, or the memory 118, or alternatively, output from the printer 119.

In the examples described above, the die-to-database inspection is performed. However, it is not limited thereto. The die-to-die inspection may be conducted. Now, the case of performing the die-to-die inspection will be described.

In the alignment step, the alignment unit 57 reads a frame image (image to be inspected) of the die 1 and a frame image (image to be inspected) of the die 2 on which the same pattern as that of the die 1 is formed, and provides alignment between both the images, based on units of sub-pixels smaller than units of pixels. For example, the alignment can be performed using a least-squares method.

In the comparison step, the comparison unit 58 compares the frame image of the die 1 with the frame image of the die 2. The comparison unit 58 compares them, for each pixel, based on predetermined determination conditions in order to determine whether there is a defect such as a shape defect. For example, if a gray scale level difference in each pixel is larger than the determination threshold Th, it is determined that there is a defect. Then, the comparison result is output. It is output specifically to the storage device 109, the monitor 117, or the memory 118.

As described above, according to the first embodiment, when acquiring an image with multiple beams, noise can be reduced based on averaging processing corresponding to a necessary averaging frequency, without repeatedly scanning the same position the number of times needed as the averaging frequency. Therefore, since a measured image in which noise has been reduced is used, inspection can be performed with high accuracy.

Second Embodiment

Although, in the first embodiment, the individual scan regions 27 extending in the longitudinal direction of the stripe region 32 are set for each stripe region 32 such that each beam does not overlap each other in a scanning direction (moving direction of the stage), and scanning is continuously performed for each individual scan region 27, it is not limited thereto. A second embodiment describes the case where, for example, a rectangular individual block is set and scanned by each beam. The configuration of the pattern inspection apparatus in the second embodiment is the same as that of FIG. 1. Moreover, the flowchart of main steps of the pattern inspection method in the second embodiment is the same as that of FIG. 7. The contents of the second embodiment are the same as those of the first embodiment except what is particularly described below.

FIGS. 14A and 14B illustrate scanning operations with multiple beams according to the second embodiment. FIG. 14A shows the case of the multiple primary electron beams 20 of 3×3 (rows by columns). As shown in FIG. 14B, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. In the case of FIG. 14B, by rotating the arranging direction of the multiple primary electron beams 20 of 3×3 on the substrate 101 by, for example, the tilt angle θ shown in the equation (1), a plurality of the primary electron beams 10 of the multiple primary electron beams 20 can be arranged not to be parallel to the moving direction of the stage 105.

In the parameter setting step (S102), the averaging frequency setting unit 60 sets, as one of parameters, an image averaging frequency (that is, the frequency (the number of times) used for image averaging). The image averaging frequency (the number of times) can be variably set from one to the number of beams of the multiple primary electron beams 20. However, in the case of the image averaging frequency being one, since it does not change from the original image, it cannot be said that this state has been averaged. Therefore, here, it is variably set from two to the number of beams of the multiple primary electron beams. For example, if the multiple primary electron beams 20 of 3×3 can be applied, the image averaging frequency can be variably set from two to nine. Moreover, the line scan direction setting unit 61 sets, as another parameter, the line scan direction of each beam. Here, as shown in FIG. 14A, the line scan direction of each beam is set to be the direction shifted (rotated) by the tilt angle θ from the y axis, for example.

In the individual region setting step (S104), the individual region setting unit 62 sets an individual block region 28 for each beam as another example of the individual scan region of each beam on the substrate 101 which extends in parallel to the moving direction of the stage 105, by relatively shifting the angle of the moving direction of the stage 105 and the angle of the array arranging direction of multiple primary electron beams from each other. According to the second embodiment, a rectangular including square block scan region whose side has a length of a beam pitch, being a pitch between mutually adjacent beams, is set for each beam of the multiple primary electron beams 20. In the example of FIG. 14A, for each beam of the multiple primary electron beams 20, a region surrounded by a beam pitch in the direction rotated by the angle θ from the x axis and a beam pitch in the direction rotated by the angle θ from the y axis, where the beam currently concerned is located, is set as the individual block region 28. In the case of FIG. 14A, there are set nine rectangular (an example of a quadrangle) including square individual block regions 28 (individual scan regions) of from 1 to 9, three rows by three columns, each of which is a region surrounded by the beam pitch in the direction rotated by the angle θ from the x axis and the beam pitch in the direction rotated by the angle θ from the y axis. In the second embodiment, in FIG. 14A, beams individually corresponding to the nine individual block regions 28 from 1 to 9 are defined as beams 1 to 9.

In the scan width setting step (S106), the scan width setting unit 64 variably sets the scan region width (individual beam scan width) of each beam so that the individual block regions 28 of other beams may be included in the direction rotated by the angle θ from the moving direction (the x direction) of the stage 105 and/or the direction rotated by the angle θ from the y axis which is perpendicular to the moving direction of the stage 105. In the second embodiment, the scan region width of each primary electron beam 10 can be set such that the block scan regions of other beams are included in the two-dimensional direction. The scan width setting unit 64 variably sets the scan region width, which is to be scanned by each primary electron beam 10 of the multiple primary electron beams 20 and is in the direction rotated by the angle θ from the x axis and/or the direction rotated by the angle θ from the y axis, correspondingly depending on the image averaging frequency (frequency used for image averaging) which can be set variably. In other words, the scan width setting unit 64 expands the scan region width of each primary electron beam 10, which is in the direction rotated by the angle θ from the x axis and/or the direction rotated by the angle θ from the y axis, depending on (corresponding to) the image averaging frequency. As shown in FIG. 14B, the maximum scan region per beam is the nine individual block regions 28 of 3×3 where the individual block region 28 of the beam currently concerned is located at the lower left corner. For example, when the image averaging frequency is three, the scan region width to be scanned by each primary electron beam 10 may be three individual block regions 28 in the direction rotated by the angle θ from the x axis, or may be three individual block regions 28 in the direction rotated by the angle θ from the y axis. For example, the scan region to be scanned by the beam 1 may be individual block regions 28 of the beams 1, 2, and 3, or may be individual block regions 28 of the beams 1, 4, and 7.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105. In the example of FIG. 14B, after each beam scans its currently associated individual block region 28, the image acquisition mechanism 150 shifts an irradiation position of each beam by the distance obtained by dividing the product of the number of beams and the beam pitch, which are in the direction rotated by the angle θ from the x axis, by sin(θ), and then, scans the next individual block region 28 for each beam. Subsequently, this is repeated. In the case of FIG. 14B, for example, when the image averaging frequency is three, the beam 1 scans the three individual block regions 28 of the beams 1, 4, and 7, for example. In the case of FIG. 14B, scanning of the individual scan region of each beam is repeated at a constant pitch. By this, it becomes possible to acquire an image which is not overlapped except for the overlapped portion set in the scan width setting step (S106). Then, by expanding the scan width of each beam in the scan width setting step (S106), images of the same position can be acquired by a plurality of beams corresponding to the image averaging frequency.

The contents of the subsequent steps are the same as those of the first embodiment. For example, in the averaging step (S122), using image data of each beam, the averaging unit 76 in the image correction circuit 141 averages errors of the image data by superimposing image data of the same position at the number being the same as that indicated by an image averaging frequency having been set.

As described above, according to the second embodiment, similarly to the first embodiment, when acquiring an image with multiple beams, noise can be reduced based on averaging processing corresponding to a necessary averaging frequency, without repeatedly scanning the same position the number of times needed as the averaging frequency. Therefore, since a measured image in which noise has been reduced is used, inspection can be performed with high accuracy.

Further, according to the second embodiment, when expanding the scan width in the direction rotated by the angle from the x axis, it is possible to reduce the influence of difference due to deviation of gray-scale level values at the beam connecting portion (image boundary) between individual scan regions 27 which are mutually adjacent in the direction rotated by the angle θ from the x axis. Moreover, when expanding the scan width in the direction rotated by the angle θ from the y axis, it is possible to reduce the influence of difference due to deviation of gray-scale level values at the beam connecting portion (image boundary) between individual scan regions 27 which are mutually adjacent in the direction rotated by the angle θ from the y axis. Furthermore, when expanding the scan width in both the direction rotated by the angle θ from the x axis and the direction rotated by the angle θ from the y axis, it is possible to reduce the influence of difference due to deviation of gray-scale level values at the beam connecting portions (image boundaries) between individual scan regions 27 which are mutually adjacent in both the direction rotated by the angle θ from the x axis and the direction rotated by the angle θ from the y axis.

Third Embodiment

A third embodiment describes a modified example of the second embodiment. The configuration of the pattern inspection apparatus in the third embodiment is the same as that of FIG. 1. Moreover, the flowchart of main steps of the pattern inspection method in the third embodiment is the same as that of FIG. 7. The contents of the third embodiment are the same as those of the first or second embodiment except what is particularly described below.

FIGS. 15A and 15B illustrate scanning operations with multiple beams according to the third embodiment. FIG. 15A shows the case of the multiple primary electron beams 20 of 3×3 (rows by columns). As shown in FIG. 15B, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. In the case of FIG. 15B, by rotating the arranging direction of the multiple primary electron beams 20 of 3×3 on the substrate 101 by, for example, the tilt angle θ shown in the equation (1), a plurality of the primary electron beams 10 of the multiple primary electron beams 20 can be arranged not to be parallel to the moving direction of the stage 105.

The contents of the parameter setting step (S102) are the same as those of the second embodiment. The line scan direction setting unit 61 sets, as another parameter, the line scan direction of each beam. Here, as shown in FIG. 15A, the line scan direction of each beam is set to be the direction shifted (rotated) by the tilt angle θ from the y axis, for example.

In the individual region setting step (S104), the individual region setting unit 62 sets the individual block region 28 for each beam as another example of the individual scan region of each beam on the substrate 101 which extends in parallel to the moving direction of the stage 105, by relatively shifting the angle of the moving direction of the stage 105 and the angle of the array arranging direction of multiple primary electron beams from each other. In the case of FIG. 15A, for each beam of the multiple primary electron beams 20, the individual region setting unit 62 sets, as the individual block region 28, a parallelogram (an example of a quadrangle) region having a side length obtained by dividing the beam pitch in the direction rotated by the angle θ from the x axis by sin (θ) and another side length of the beam pitch in the direction rotated by the angle θ from the y axis.

In the example of FIG. 15A, for each beam, the individual region setting unit 62 sets nine quadrangular individual block regions 28 (individual scan regions) of from 1 to 9, three rows by three columns, each of which is a parallelogram region having a side length obtained by dividing the beam pitch in the direction rotated by the angle θ from the x axis by sin (θ) and another side length of the beam pitch in the direction rotated by the angle θ from the y axis.

In the scan width setting step (S106), the scan width setting unit 64 variably sets the scan region width (individual beam scan width) of each beam so that the individual block regions 28 of other beams may be included in the direction of the moving direction (the x direction) of the stage 105 and/or the direction rotated by the angle θ from the y axis which is perpendicular to the moving direction of the stage 105. The scan width setting unit 64 variably sets the scan region width, which is to be scanned by each primary electron beam 10 of the multiple primary electron beams 20 and is in the x direction and/or the direction rotated by the angle θ from the y axis, correspondingly depending on the image averaging frequency (frequency used for image averaging) which can be set variably. In other words, the scan width setting unit 64 expands the scan region width of each primary electron beam 10, in the x direction and/or the direction rotated by the angle θ from the y axis, correspondingly depending on the image averaging frequency. As shown in FIG. 15B, the maximum scan region per beam is the region surrounded by the width of three individual block regions 28 in the x direction and the width of three individual block regions 28 in the direction rotated by the angle θ from the y axis, where the individual block region 28 of the beam currently concerned is located at the lower left corner.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105. In the example of FIG. 15B, after each beam scans its currently associated individual block region 28, the image acquisition mechanism 150 shifts the irradiation position of each beam by the distance obtained by dividing the product of the number of beams and the beam pitch, which are in the direction rotated by the angle θ from the x axis, by sin(θ), and then, scans the next individual block region 28 for each beam. Subsequently, this is repeated. In the example of FIG. 15B, for example, in the case of the image averaging frequency being three and expanding the scan region width in the direction rotated by the angle θ from the y axis, the beam 3 scans the three individual block regions 28 of the beams 3, 6, and 9, for example. On the other hand, in the case of expanding the scan region width in the x direction, for example, the beam 3 scans the individual block region 28 of the beam 3, a part of the individual block region 28 of the beam 1, a part of the individual block region 28 of the beam 4, a part of the individual block region 28 of the beam 2, and a part of the individual block region 28 of the beam 5. Thus, the boundaries of the individual block regions 28 arranged in the x direction can be shifted.

In the example of FIG. 15B, scanning of the individual scan region of each beam is repeated at a constant pitch. By this, it becomes possible to acquire an image which is not overlapped except for the overlapped portion set in the scan width setting step (S106). Then, by expanding the scan width of each beam in the scan width setting step (S106), images of the same position can be acquired by a plurality of beams corresponding to the image averaging frequency.

The contents of the subsequent steps are the same as those of the first embodiment. For example, in the averaging step (S122), using image data of each beam, the averaging unit 76 in the image correction circuit 141 averages errors of the image data by superimposing image data of the same position at the number being the same as that indicated by an image averaging frequency having been set.

As described above, according to the third embodiment, similarly to the first and second embodiments, when acquiring an image with multiple beams, noise can be reduced based on averaging processing corresponding to a necessary averaging frequency, without repeatedly scanning the same position the number of times needed as the averaging frequency. Therefore, since a measured image in which noise has been reduced is used, inspection can be performed with high accuracy.

Moreover, according to the third embodiment, since boundaries in the y direction of the individual block regions 28 arranged in the x direction shift, when expanding the scan width in the x direction, it is possible to reduce the influence of difference due to deviation of gray-scale level values at the beam connecting portion (image boundary) between individual scan regions 27 which are mutually adjacent in the x direction and the direction rotated by the angle θ from the y axis.

Fourth Embodiment

A fourth embodiment describes a modified example of the third embodiment. The configuration of the pattern inspection apparatus in the fourth embodiment is the same as that of FIG. 1. Moreover, the flowchart of main steps of the pattern inspection method in the fourth embodiment is the same as that of FIG. 7. The contents of the fourth embodiment are the same as those of any of the first to third embodiments except what is particularly described below.

Figures 16A, 16B:
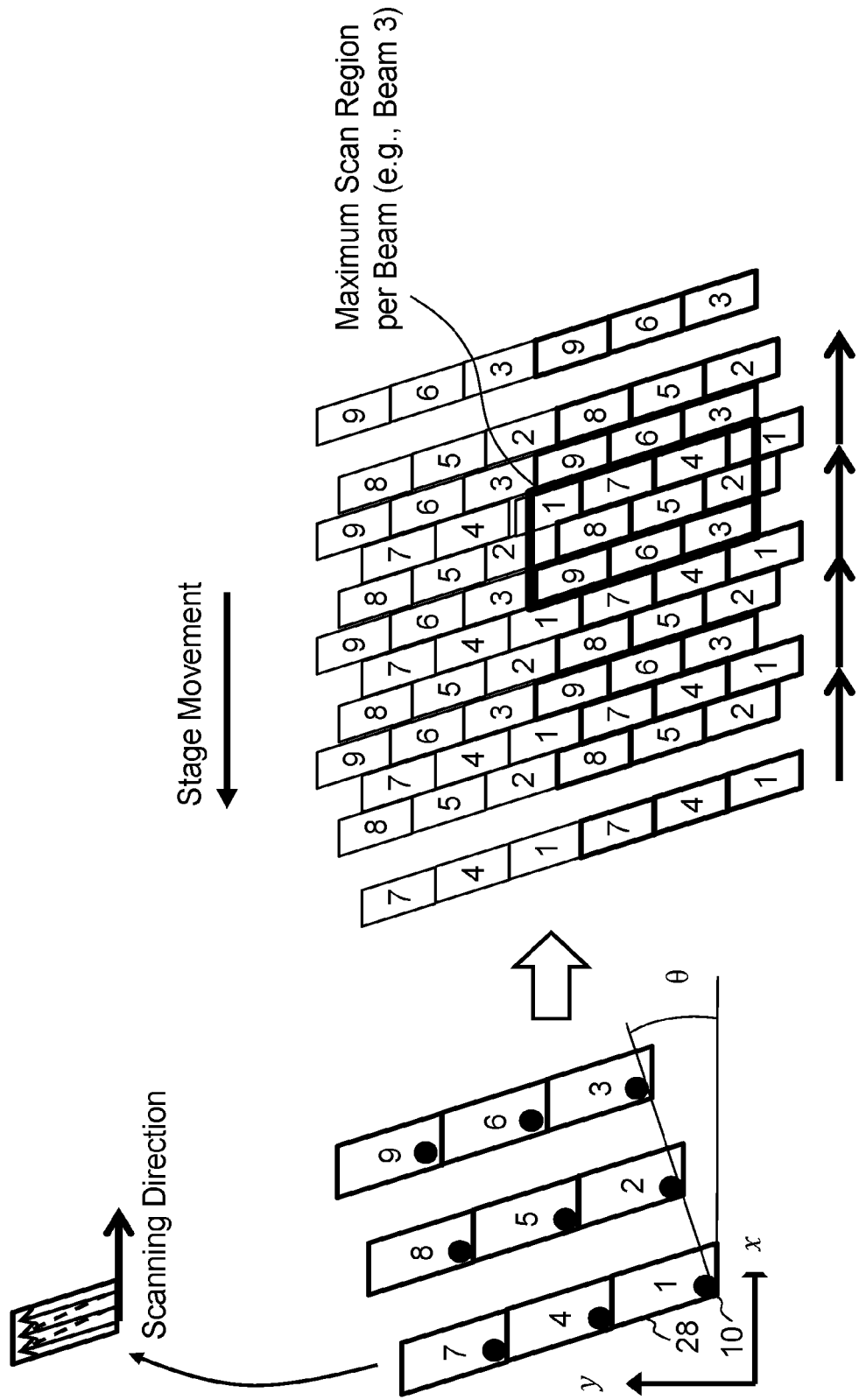
FIGS. 16A and 16B illustrate scanning operations with multiple beams according to a fourth embodiment.

FIGS. 16A and 16B illustrate scanning operations with multiple beams according to the fourth embodiment. FIG. 16A shows the case of the multiple primary electron beams 20 of 3×3 (rows by columns). As shown in FIG. 16B, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. In the case of FIG. 16B, by rotating the arranging direction of the multiple primary electron beams 20 of 3×3 on the substrate 101 by, for example, the tilt angle θ shown in the equation (1), a plurality of the primary electron beams 10 of the multiple primary electron beams 20 can be arranged not to be parallel to the moving direction of the stage 105.

The contents of the parameter setting step (S102) are the same as those of the second embodiment. The line scan direction setting unit 61 sets, as another parameter, the line scan direction of each beam. Here, as shown in FIG. 16A, the line scan direction of each beam is set to be the direction shifted (rotated) by the tilt angle θ from the y axis, for example.

In the individual region setting step (S104), the individual region setting unit 62 sets the individual block region 28 for each beam as another example of the individual scan region of each beam on the substrate 101 which extends in parallel to the moving direction of the stage 105, by relatively shifting the angle of the moving direction of the stage 105 and the angle of the array arranging direction of multiple primary electron beams from each other. In the case of FIG. 16A, for each beam of the multiple primary electron beams 20, the individual region setting unit 62 sets, as the individual block region 28, a parallelogram region having a side length of half of what is obtained by dividing the beam pitch in the direction rotated by the angle θ from the x axis by sin(θ) and another side length of the beam pitch in the direction rotated by the angle θ from the y axis. The example of FIG. 16A shows the state where an example of the individual block region 28 of FIG. 15A is divided into two in the x direction. In the case of FIG. 16A, for each beam, the individual region setting unit 62 sets nine quadrangular individual block regions 28 (individual scan regions) of from 1 to 9, three rows by three columns, each of which is a parallelogram region having a side length of half of what is obtained by dividing the beam pitch in the direction rotated by the angle θ from the x axis by sin(θ) and another side length of the beam pitch in the direction rotated by the angle θ from the y axis.

In the scan width setting step (S106), the scan width setting unit 64 variably sets the scan region width (individual beam scan width) of each beam so that the individual block regions 28 of other beams may be included in the direction of the moving direction (the x direction) of the stage 105 and/or the direction rotated by the angle θ from the y axis which is perpendicular to the moving direction of the stage 105. The scan width setting unit 64 variably sets the scan region width, which is to be scanned by each primary electron beam 10 of the multiple primary electron beams 20 and is in the x direction and/or the direction rotated by the angle θ from the y axis, correspondingly depending on the image averaging frequency (frequency used for image averaging) which can be set variably. In other words, the scan width setting unit 64 expands the scan region width of each primary electron beam 10, in the x direction and/or the direction rotated by the angle θ from the y axis, correspondingly depending on the image averaging frequency. As shown in FIG. 16B, the maximum scan region per beam is the region surrounded by the width of three individual block regions 28 in the x direction and the width of three individual block regions 28 in the direction rotated by the angle θ from the y axis, where the individual block region 28 of the beam currently concerned is located at the lower left corner.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105. In the example of FIG. 16B, after each beam scans its currently associated individual block region 28, the image acquisition mechanism 150 shifts the irradiation position of each beam by the distance obtained by dividing the product of the number of beams and ½ of the beam pitch, which are in the direction rotated by the angle θ from the x axis, by sin(θ), and then, scans the next individual block region 28 for each beam. Subsequently, this is repeated. In the example of FIG. 16B, for example, in the case of the image averaging frequency being three and expanding the scan region width in the direction rotated by the angle θ from the y axis, the beam 3 scans the three individual block regions 28 of the beams 3, 6, and 9, for example. On the other hand, in the case of expanding the scan region width in the x direction, for example, the beam 3 scans the individual block region 28 of the beam 3, a part of the individual block region 28 of the beam 2, a part of the individual block region 28 of the beam 5, a part of the individual block region 28 of the beam 1, and a part of the individual block region 28 of the beam 4. Thus, the boundaries of the individual block regions 28 arranged in the x direction can be shifted.

In the example of FIG. 16B, scanning of the individual scan region of each beam is repeated at a constant pitch. According to the fourth embodiment, even when the individual block region 28 in the stage moving direction is divided, an image can be acquired without a space. Thus, it becomes possible to acquire an image which is not overlapped except for the overlapped portion set in the scan width setting step (S106). Then, by expanding the scan width of each beam in the scan width setting step (S106), images of the same position can be acquired by a plurality of beams corresponding to the image averaging frequency.

The contents of the subsequent steps are the same as those of the first embodiment. For example, in the averaging step (S122), using image data of each beam, the averaging unit 76 in the image correction circuit 141 averages errors of the image data by superimposing image data of the same position at the number being the same as that indicated by an image averaging frequency having been set.

As described above, according to the fourth embodiment, similarly to the first, second, and third embodiments, when acquiring an image with multiple beams, noise can be reduced based on averaging processing corresponding to a necessary averaging frequency, without repeatedly scanning the same position the number of times needed as the averaging frequency. Therefore, since a measured image in which noise has been reduced is used, inspection can be performed with high accuracy.

Moreover, similarly to the third embodiment, since boundaries in the y direction of the individual block regions 28 arranged in the x direction shift, when expanding the scan width in the x direction, it is possible to reduce the influence of difference due to deviation of gray-scale level values at the beam connecting portion (image boundary) between individual scan regions 27 which are mutually adjacent in the x direction and the direction rotated by the angle θ from the y axis. Further, according to the fourth embodiment, since the size of the individual block region 28 in the x direction can be decreased, it is possible to reduce the deflection width in the x direction of the multiple primary electron beams 20.

Fifth Embodiment

A fifth embodiment describes a modified example of the fourth embodiment. The configuration of the pattern inspection apparatus in the fifth embodiment is the same as that of FIG. 1. Moreover, the flowchart of main steps of the pattern inspection method in the fifth embodiment is the same as that of FIG. 7. The contents of the fifth embodiment are the same as those of any of the first to fourth embodiments except what is particularly described below.

Figure 17A:
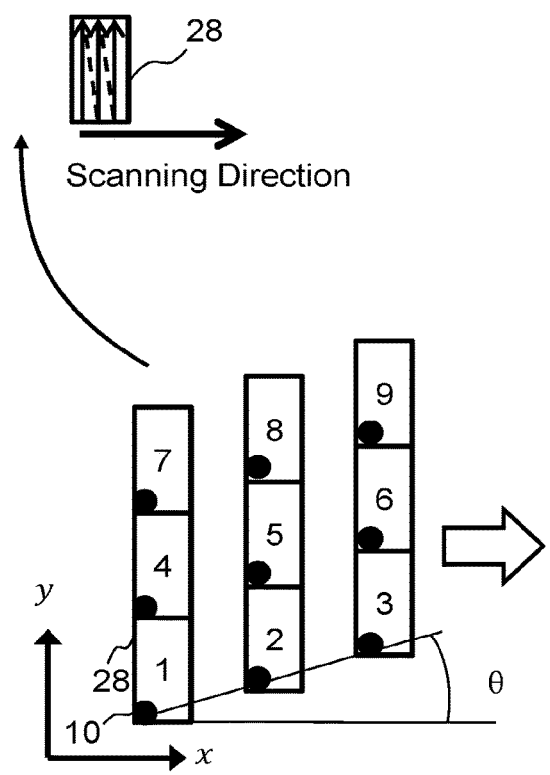
FIGS. 17A and 17B illustrate scanning operations with multiple beams according to a fifth embodiment.
Figure 17B:
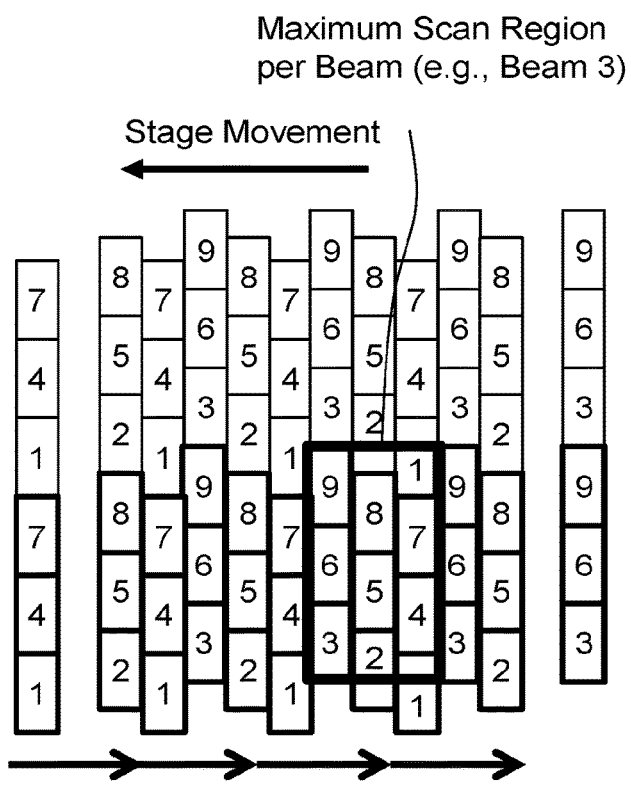

FIGS. 17A and 17B illustrate scanning operations with multiple beams according to the fifth embodiment. FIG. 17A shows the case of the multiple primary electron beams 20 of 3×3 (rows by columns). As shown in FIG. 17B, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. In the case of FIG. 17B, by rotating the arranging direction of the multiple primary electron beams 20 of 3×3 on the substrate 101 by, for example, the tilt angle θ shown in the equation (1), a plurality of the primary electron beams 10 of the multiple primary electron beams 20 can be arranged not to be parallel to the moving direction of the stage 105.

The contents of the parameter setting step (S102) are the same as those of the second embodiment. The line scan direction setting unit 61 sets, as another parameter, the line scan direction of each beam. Here, as shown in FIG. 17A, the line scan direction of each beam is set to be, for example, the y direction without shifting by the tilt angle θ.

In the individual region setting step (S104), the individual region setting unit 62 sets the individual block region 28 for each beam as another example of the individual scan region of each beam on the substrate 101 which extends in parallel to the moving direction of the stage 105, by relatively shifting the angle of the moving direction of the stage 105 and the angle of the array arranging direction of multiple primary electron beams from each other. In the case of FIG. 17A, for each beam of the multiple primary electron beams 20, the individual region setting unit 62 sets, as the individual block region 28, a rectangular region having a side length of half of what is obtained by dividing the beam pitch in the direction rotated by the angle θ from the x axis by sin(θ) and another side length of the beam pitch in the y direction. In the case of FIG. 17A, for each beam, the individual region setting unit 62 sets nine rectangular individual block regions 28 (individual scan regions) of from 1 to 9, three rows by three columns, each of which is a rectangular region having a side length of half of what is obtained by dividing the beam pitch in the direction rotated by the angle θ from the x axis by sin(θ) and another side length of the beam pitch in the y direction.

In the scan width setting step (S106), the scan width setting unit 64 variably sets the scan region width (individual beam scan width) of each beam so that the individual block regions 28 of other beams may be included in the direction of the moving direction (the x direction) of the stage 105 and/or the y direction perpendicular to the moving direction of the stage 105. The scan width setting unit 64 variably sets the scan region width, which is to be scanned by each primary electron beam 10 of the multiple primary electron beams 20 and is in the x direction and/or the y direction, correspondingly depending on the image averaging frequency (frequency used for image averaging) which can be set variably. In other words, the scan width setting unit 64 expands the scan region width of each primary electron beam 10, in the x direction and/or the y direction, correspondingly depending on the image averaging frequency. As shown in FIG. 17B, the maximum scan region per beam is the region surrounded by the width of three individual block regions 28 in the x direction and the width of three individual block regions 28 in the y direction, where the individual block region 28 of the beam currently concerned is located at the lower left corner.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105. In the example of FIG. 17B, after each beam scans its currently associated individual block region 28, the image acquisition mechanism 150 shifts the irradiation position of each beam by the distance obtained by dividing the product of the number of beams and ½ of the beam pitch, which are in the direction rotated by the angle θ from the x axis, by sin(θ), and then, scans the next individual block region 28 for each beam. Subsequently, this is repeated. In the example of FIG. 17B, for example, in the case of the image averaging frequency being three and expanding the scan region width in the y direction, the beam 3 scans the three individual block regions 28 of the beams 3, 6, and 9, for example. On the other hand, in the case of expanding the scan region width in the x direction, for example, the beam 3 scans the individual block region 28 of the beam 3, a part of the individual block region 28 of the beam 2, a part of the individual block region 28 of the beam 5, a part of the individual block region 28 of the beam 1, and a part of the individual block region 28 of the beam 4. Thus, the boundaries of the individual block regions 28 arranged in the x direction can be shifted.

In the example of FIG. 17B, scanning of the individual scan region of each beam is repeated at a constant pitch. According to the fifth embodiment, without inclining the individual block region 28, when the beam arrangement is inclined against the stage moving direction, an image can be acquired without a space. In other words, 90 degree scanning can be performed against the x axis. Thereby, it becomes possible to acquire an image which is not overlapped except for the overlapped portion set in the scan width setting step (S106). Then, by expanding the scan width of each beam in the scan width setting step (S106), images of the same position can be acquired by a plurality of beams corresponding to the image averaging frequency.

The contents of the subsequent steps are the same as those of the first embodiment. For example, in the averaging step (S122), using image data of each beam, the averaging unit 76 in the image correction circuit 141 averages errors of the image data by superimposing image data of the same position at the number being the same as that indicated by an image averaging frequency having been set.

As described above, according to the fifth embodiment, similarly to the first to fourth embodiments, when acquiring an image with multiple beams, noise can be reduced based on averaging processing corresponding to a necessary averaging frequency, without repeatedly scanning the same position the number of times needed as the averaging frequency. Therefore, since a measured image in which noise has been reduced is used, inspection can be performed with high accuracy.

Moreover, similarly to the third and fourth embodiments, since boundaries in the y direction of the individual block regions 28 arranged in the x direction shift, when expanding the scan width in the x direction, it is possible to reduce the influence of difference due to deviation of gray-scale level values at the beam connecting portion (image boundary) between individual scan regions 27 which are mutually adjacent in the x direction and the direction rotated by the angle θ from the y axis. Further, according to the fifth embodiment, since the size of the individual block region 28 in the x direction can be decreased, it is possible to reduce the deflection width in the x direction of the multiple primary electron beams 20.

Sixth Embodiment

A sixth embodiment describes a modified example of the first embodiment. The configuration of the pattern inspection apparatus in the sixth embodiment is the same as that of FIG. 1. Moreover, the flowchart of main steps of the pattern inspection method in the sixth embodiment is the same as that of FIG. 7. The contents of the sixth embodiment are the same as those of any of the first to fourth embodiments except what is particularly described below.

Figure 18:
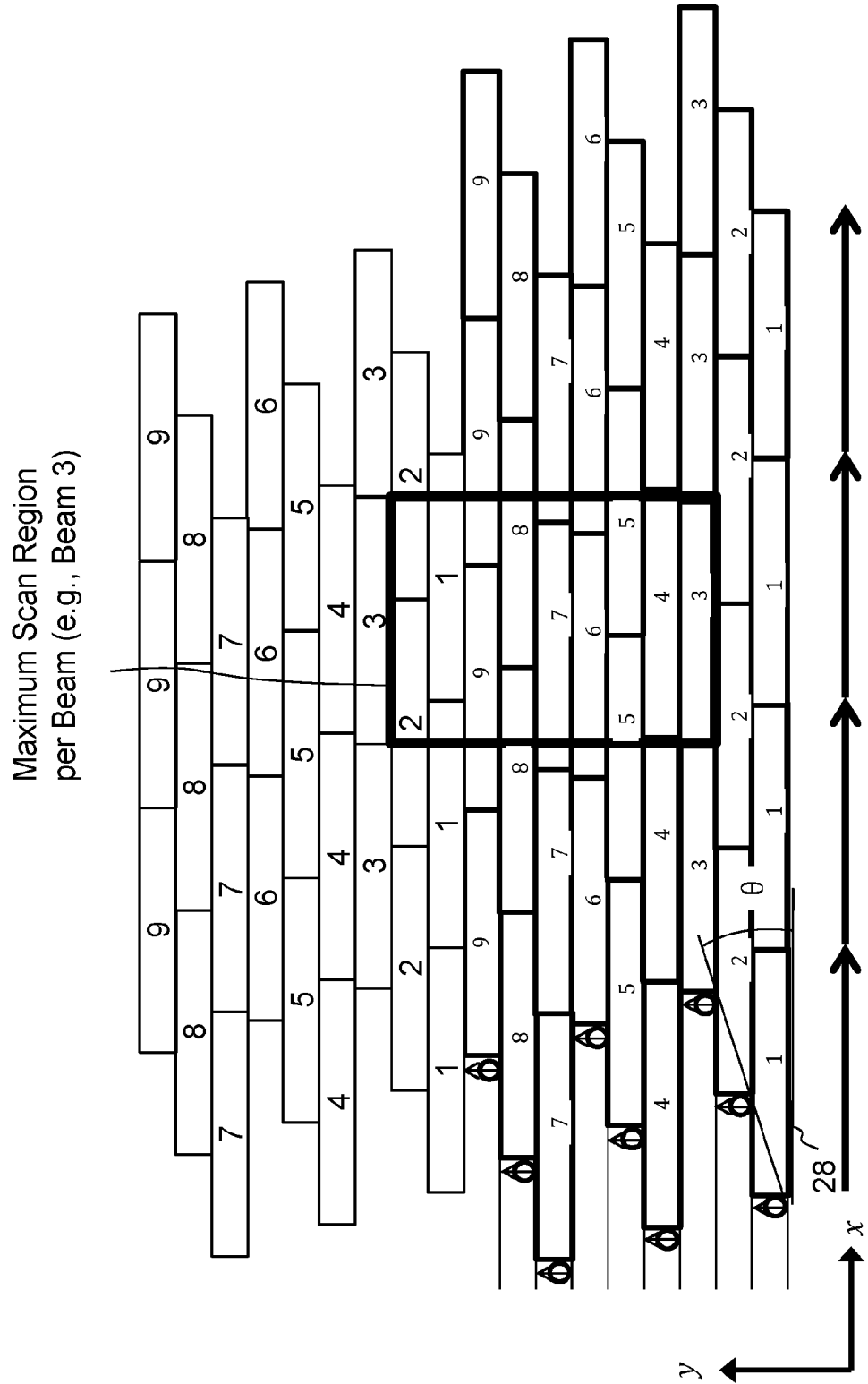
FIG. 18 illustrates scanning operations with multiple beams according to a sixth embodiment.

FIG. 18 illustrates scanning operations with multiple beams according to the sixth embodiment. FIG. 18 shows the case of the multiple primary electron beams 20 of 3×3 (rows by columns). As shown in FIG. 18, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. In the case of FIG. 18, by rotating the arranging direction of the multiple primary electron beams 20 of 3×3 on the substrate 101 by, for example, the tilt angle θ shown in the equation (1), a plurality of the primary electron beams 10 of the multiple primary electron beams 20 can be arranged not to be parallel to the moving direction of the stage 105.

The contents of the parameter setting step (S102) are the same as those of the second embodiment. The line scan direction setting unit 61 sets, as another parameter, the line scan direction of each beam. Here, as shown in FIG. 18, the line scan direction of each beam is set to be, for example, the y direction without shifting by the tilt angle θ.

In the individual region setting step (S104), the individual region setting unit 62 sets the individual block region 28 for each beam as another example of the individual scan region of each beam on the substrate 101 which extends in parallel to the moving direction of the stage 105, by relatively shifting the angle of the moving direction of the stage 105 and the angle of the array arranging direction of multiple primary electron beams from each other. In the case of FIG. 18, for each beam of the multiple primary electron beams 20, the individual region setting unit 62 divides each individual scan region 27 extending in the x direction shown in FIG. 4B into a plurality of individual block regions 28 by the size obtained by dividing the product of the number of beams and the beam pitch, which are in the direction rotated by the angle θ from the x axis, by sin (θ). Moreover, the individual block region 28 adjacent in the y direction is set to be shifted by the size obtained by dividing by sin(θ) the beam pitch in the direction rotated by the angle θ from the x axis.

In the scan width setting step (S106), the scan width setting unit 64 variably sets the scan region width (individual beam scan width) of each beam so that the individual block regions 28 of other beams may be included in the y direction perpendicular to the moving direction of the stage 105. The scan width setting unit 64 variably sets the scan region width in the y direction which is to be scanned by each primary electron beam 10 of the multiple primary electron beams 20, correspondingly depending on the image averaging frequency which can be set variably. In other words, the scan width setting unit 64 expands the scan region width in the y direction of each primary electron beam 10, correspondingly depending on the image averaging frequency. As shown in FIG. 18, the maximum scan region per beam is the region of nine individual block regions 28 in the y direction including the individual block region 28 of the beam currently concerned.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105. In the example of FIG. 18, after each beam scans its currently associated individual block region 28, the image acquisition mechanism 150 shifts the irradiation position of each beam by the distance obtained by dividing the product of the number of beams and the beam pitch, which are in the direction rotated by the angle θ from the x axis, by sin (θ), and then, scans the next individual block region 28 for each beam. Subsequently, this is repeated. In the example of FIG. 18, for example, in the case of the image averaging frequency being three and expanding the scan region width in the y direction, the beam 3 scans the individual block region 28 of the beam 3, a part of the individual block region 28 of the beam 4, and a part of the individual block region 28 of the beam 5. Thus, the boundaries in the x direction of the individual block regions 28 arranged in the y direction can be shifted.

According to the sixth embodiment, the one-dimensional scanning described in the first embodiment can be carried out as a repetition of two-dimensional scanning. Thereby, it becomes possible to acquire an image which is not overlapped except for the overlapped portion set in the scan width setting step (S106). Then, by expanding the scan width of each beam in the scan width setting step (S106), images of the same position can be acquired by a plurality of beams corresponding to the image averaging frequency.

The contents of the subsequent steps are the same as those of the first embodiment. For example, in the averaging step (S122), using image data of each beam, the averaging unit 76 in the image correction circuit 141 averages errors of the image data by superimposing image data of the same position at the number being the same as that indicated by an image averaging frequency having been set.

As described above, according to the sixth embodiment, similarly to the first to fourth embodiments, when acquiring an image with multiple beams, noise can be reduced based on averaging processing corresponding to a necessary averaging frequency, without repeatedly scanning the same position the number of times needed as the averaging frequency. Therefore, since a measured image in which noise has been reduced is used, inspection can be performed with high accuracy.

Seventh Embodiment

A seventh embodiment describes a modified example of the third embodiment. The configuration of the pattern inspection apparatus in the seventh embodiment is the same as that of FIG. 1. Moreover, the flowchart of main steps of the pattern inspection method in the seventh embodiment is the same as that of FIG. 7. The contents of the seventh embodiment are the same as those of any of the first to fourth embodiments except what is particularly described below.

Figures 19A, 19B:
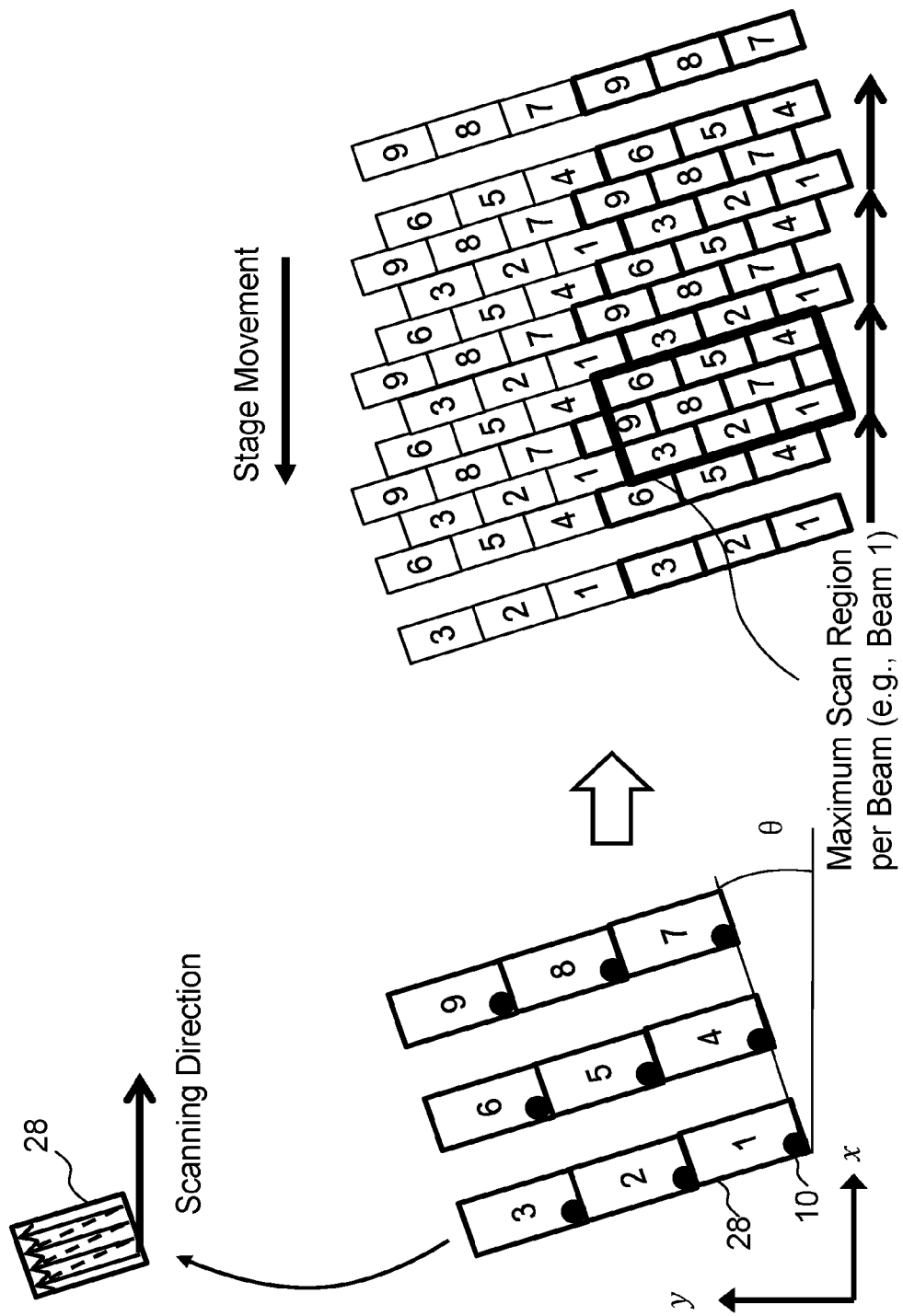
FIGS. 19A and 19B illustrate scanning operations with multiple beams according to the seventh embodiment.

FIGS. 19A and 19B illustrate scanning operations with multiple beams according to the seventh embodiment. FIGS. 19A and 19B show the case of the multiple primary electron beams 20 of 3×3 (rows by columns). In FIGS. 19A and 19B, each arrangement of beams of 1, 2, and 3, beams of 4, 5, and 6, and beams of 7, 8, and 9 is in the y direction, where the arrangements are arranged in the x direction. As shown in FIGS. 19A and 19B, the angle of the moving direction of the stage 105 and the angle of the arranging direction of the multiple primary electron beams 20 are relatively shifted from each other so that a plurality of the primary electron beams 10 of the multiple primary electron beams 20 may not be arranged in parallel to the moving direction of the stage 105. In the case of FIGS. 19A and 19B, by rotating the arranging direction of the multiple primary electron beams 20 of 3×3 on the substrate 101 by, for example, the tilt angle θ shown in the equation (1), a plurality of the primary electron beams 10 of the multiple primary electron beams 20 can be arranged not to be parallel to the moving direction of the stage 105.

The contents of the parameter setting step (S102) are the same as those of the second embodiment. The line scan direction setting unit 61 sets, as another parameter, the line scan direction of each beam. Here, as shown in FIG. 19A, the line scan direction of each beam is set to be the direction shifted (rotated) by the tilt angle θ from the y axis, for example.

In the individual region setting step (S104), the individual region setting unit 62 sets the individual block region 28 for each beam as another example of the individual scan region of each beam on the substrate 101 which extends in parallel to the moving direction of the stage 105, by relatively shifting the angle of the moving direction of the stage 105 and the angle of the array arranging direction of multiple primary electron beams from each other. In the case of FIG. 19A, for each beam of the multiple primary electron beams 20, the individual region setting unit 62 sets, as the individual block region 28, a rectangular region having a side length of half of the beam pitch in the direction rotated by the angle θ from the x axis and another side length of the beam pitch in the direction rotated by the angle θ from the y axis. The example of FIG. 19A shows the state where an example of the individual block region 28 of FIG. 14A is divided into two in the x direction.

In the scan width setting step (S106), the scan width setting unit 64 variably sets the scan region width (individual beam scan width) of each beam so that the individual block regions 28 of other beams may be included in the direction rotated by the angle θ from the moving direction (the x direction) of the stage 105 and/or the direction rotated by the angle θ from the y axis which is perpendicular to the moving direction of the stage 105. The scan width setting unit 64 variably sets the scan region width, which is to be scanned by each primary electron beam 10 of the multiple primary electron beams 20 and is in the direction rotated by the angle θ from the x axis and/or the direction rotated by the angle θ from the y axis, correspondingly depending on the image averaging frequency (frequency used for image averaging) which can be set variably. In other words, the scan width setting unit 64 expands the scan region width of each primary electron beam 10, which is in the direction rotated by the angle θ from the x axis and/or the direction rotated by the angle θ from the y axis, depending on (corresponding to) the image averaging frequency. As shown in FIG. 19B, the maximum scan region per beam is the region surrounded by the width of three individual block regions 28 in the direction rotated by the angle θ from the x axis and the width of three individual block regions 28 in the direction rotated by the angle θ from the y axis, where the individual block region 28 of the beam currently concerned is located at the lower left corner.

In the scanning step (S108), in the state where the scan region width to be scanned by each primary electron beam 10 of the multiple primary electron beams 20 has been variably set correspondingly depending on the image averaging frequency which can be set variably, the image acquisition mechanism 150 acquires image data of each beam by scanning the substrate 101 with the multiple primary electron beams 20 deflected by the sub deflector 209 while relatively shifting the angle of the moving direction of the stage 105 and the angle of the arranging direction of the multiple primary electron beams 20 from each other so that a plurality of beams of the multiple primary electron beams 20 may not be arranged in parallel to the moving direction of the stage 105. In the example of FIG. 19B, after each beam scans its currently associated individual block region 28, the image acquisition mechanism 150 shifts the irradiation position of each beam by the distance obtained by dividing the product of the number of beams and ½ of the beam pitch, which are in the direction rotated by the angle θ from the x axis, by sin (θ), and then, scans the next individual block region 28 for each beam. Subsequently, this is repeated. In the example of FIG. 19B, for example, in the case of the image averaging frequency being three and expanding the scan region width in the direction rotated by the angle θ from the y axis, the beam 1 scans the three individual block regions 28 of the beams 1, 2, and 3, for example. On the other hand, in the case of expanding the scan region width in the direction rotated by the angle θ from the x axis, for example, the beam 1 scans the individual block region 28 of the beam 1, a part of the individual block region 28 of the beam 7, a part of the individual block region 28 of the beam 9, and a part of the individual block region 28 of the beam 4. Thus, the boundaries of the individual block regions 28 arranged in the direction rotated by the angle θ from the x axis can be shifted.

In the example of FIG. 19B, scanning of the individual scan region of each beam is repeated at a constant pitch. According to the seventh embodiment, even when the individual block region 28 in the stage moving direction is divided, an image can be acquired without a space. Thus, it becomes possible to acquire an image which is not overlapped except for the overlapped portion set in the scan width setting step (S106). Then, by expanding the scan width of each beam in the scan width setting step (S106), images of the same position can be acquired by a plurality of beams corresponding to the image averaging frequency.

The contents of the subsequent steps are the same as those of the first embodiment. For example, in the averaging step (S122), using image data of each beam, the averaging unit 76 in the image correction circuit 141 averages errors of the image data by superimposing image data of the same position at the number being the same as that indicated by an image averaging frequency having been set.

As described above, according to the seventh embodiment, in addition to the effect of the second embodiment, further, it is possible to reduce the deflection width in the x direction of the multiple primary electron beams 20 since the size of the individual block region 28 in the x direction can be decreased.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the lens control circuit 124, the blanking control circuit 126, the deflection control circuit 128, the scan region setting circuit 140, and the image correction circuit 141 may be configured by at least one processing circuit described above.

Embodiments have been explained referring to specific examples described above. However, the present invention is not limited to these specific examples. Although FIG. 1 describes the case where the multiple primary electron beams 20 are formed by the shaping aperture array substrate 203 irradiated with one beam from the electron gun 201 serving as an irradiation source, it is not limited thereto. The multiple primary electron beams 20 may be formed by individual irradiation with primary electron beams from a plurality of irradiation sources.

While the apparatus configuration, control method, and the like not directly necessary for explaining the present invention are not described, some or all of them can be appropriately selected and used on a case-by-case basis when needed.

In addition, any other multiple electron beam inspection apparatus and multiple electron beam inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-charged particle beam image acquisition apparatus comprising:
an image acquisition mechanism, including a stage on which a target object is capable to be disposed and a deflector which deflects multiple charged particle beams in an array arrangement, configured to acquire, in a state where a scan region width to be scanned by each beam of the multiple charged particle beams has been set depending on an image averaging frequency, image data of the each beam by scanning the target object with the multiple charged particle beams deflected by the deflector while relatively shifting an angle of a moving direction of the stage and an angle of an array arranging direction of the multiple charged particle beams from each other; and an averaging circuit configured to average, using the image data of the each beam, errors of the image data by superimposing image data of a same position at the image averaging frequency.

2. The apparatus according to claim 1 further comprising:
an individual region setting circuit configured to set an individual scan region of the each beam on the target object which extends in parallel to the moving direction of the stage, by relatively shifting the angle of the moving direction of the stage and the angle of the array arranging direction of the multiple charged particle beams from each other, wherein
the scan region width of the each beam is set such that the individual scan region of other beam is included in a direction perpendicular to the moving direction of the stage.

3. The apparatus according to claim 1, wherein the image averaging frequency can be set variably.

4. The apparatus according to claim 1, wherein the image averaging frequency is set from two to a number of beams of the multiple charged particle beams.

5. The apparatus according to claim 1, wherein,
an individual block region, being a quadrangle, whose side has a length of a beam pitch indicating a pitch between mutually adjacent beams is set for the each beam of the multiple charged particle beams, and
the scan region width of the each beam is set such that the individual block region of other beam is included in a two-dimensional direction.

6. A multi-charged particle beam image acquisition method comprising:
acquiring, in a state where a scan region width to be scanned by each beam of multiple charged particle beams in an array arrangement has been set depending on an image averaging frequency, image data of the each beam by scanning a target object disposed on a stage with the multiple charged particle beams deflected by a deflector while relatively shifting an angle of a moving direction of the stage and an angle of an array arranging direction of the multiple charged particle beams from each other; and
averaging, using the image data of the each beam, errors of the image data by superimposing image data of a same position at the image averaging frequency.

7. The method according to claim 6 further comprising:
setting an individual scan region of the each beam on the target object which extends in parallel to the moving direction of the stage, by relatively shifting the angle of the moving direction of the stage and the angle of the array arranging direction of the multiple charged particle beams from each other, wherein
the scan region width of the each beam is set such that the individual scan region of other beam is included in a direction perpendicular to the moving direction of the stage.

8. The method according to claim 6, wherein the image averaging frequency can be set variably.

9. The method according to claim 6, wherein the image averaging frequency is set from two to a number of beams of the multiple charged particle beams.

10. The method according to claim 6, wherein,
an individual block region, being a quadrangle, whose side has a length of a beam pitch indicating a pitch between mutually adjacent beams is set for the each beam of the multiple charged particle beams, and
the scan region width of the each beam is set such that the individual block region of other beam is included in a two-dimensional direction.

11. The apparatus according to claim 1, wherein the image acquisition mechanism scans the target object with the multiple charged particle beams deflected by the deflector while relatively shifting the angle of the moving direction of the stage and the angle of the array arranging direction of the multiple charged particle beams from each other so that a plurality of beams of the multiple charged particle beams are not arranged in parallel to the moving direction of the stage.

12. The apparatus according to claim 1, wherein the image acquisition mechanism acquires, in the state where the scan region width to be scanned by the each beam of the multiple charged particle beams has been variably set correspondingly depending on the image averaging frequency having been set, the image data of the each beam.

13. The method according to claim 6, wherein the target object is scanned with the multiple charged particle beams deflected by the deflector while relatively shifting the angle of the moving direction of the stage and the angle of the array arranging direction of the multiple charged particle beams from each other so that a plurality of beams of the multiple charged particle beams are not arranged in parallel to the moving direction of the stage.

14. The method according to claim 6, wherein the image data of the each beam is acquired in the state where the scan region width to be scanned by the each beam of the multiple charged particle beams has been variably set correspondingly depending on the image averaging frequency having been set.

* * * * *